(12) United States Patent
Kikuchi et al.

(10) Patent No.: US 12,327,720 B2
(45) Date of Patent: Jun. 10, 2025

(54) METHOD OF PROCESSING SUBSTRATE, SUBSTRATE PROCESSING APPARATUS, RECORDING MEDIUM, AND MANUFACTURING SEMICONDUCTOR DEVICE

(71) Applicant: KOKUSAI ELECTRIC CORPORATION, Tokyo (JP)

(72) Inventors: Toshiyuki Kikuchi, Toyama (JP); Naofumi Ohashi, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/476,035

(22) Filed: Sep. 15, 2021

(65) Prior Publication Data
US 2022/0310386 A1    Sep. 29, 2022

(30) Foreign Application Priority Data
Mar. 29, 2021  (JP) ................. 2021-054496

(51) Int. Cl.
*H01L 21/02*  (2006.01)
*H01L 21/677*  (2006.01)

(52) U.S. Cl.
CPC .... *H01L 21/02274* (2013.01); *H01L 21/0217* (2013.01); *H01L 21/0234* (2013.01); *H01L 21/67703* (2013.01)

(58) Field of Classification Search
CPC .......... H01L 21/02274; H01L 21/0234; H01L 21/0217; H01L 21/67703; H01L 21/67276; G05B 19/18
See application file for complete search history.

(56) References Cited

U.S. PATENT DOCUMENTS 6,839,603 B2 * 1/2005 Karasawa ........ G05B 19/41865
                                                700/101
8,078,311 B2 * 12/2011 Ogi ................... H01L 21/67253
                                                700/214
(Continued)

FOREIGN PATENT DOCUMENTS

JP    2004-087600 A    3/2004
JP    2006-278531 A   10/2006
(Continued)

OTHER PUBLICATIONS

Taiwan Office Action issued on May 10, 2022 for Taiwan Patent Application No. 110131183.
(Continued)

*Primary Examiner* — Duy Vu N Deo
*Assistant Examiner* — Christopher Remavege
(74) *Attorney, Agent, or Firm* — Volpe Koenig

(57) ABSTRACT

There is provided a technique that includes: receiving type information corresponding to substrate processing; reading the type information and processing time information corresponding to the type information from a memory; calculating a ratio of a processing time of a predetermined process to a total time of the processing time information; selecting one or more reactors according to the ratio; setting the one or more reactors to be capable of performing the predetermined process; transferring a substrate corresponding to the type information to the one or more reactors; and performing the predetermined process corresponding to the type information in the one or more reactors.

18 Claims, 18 Drawing Sheets

(56) References Cited

U.S. PATENT DOCUMENTS

| | | | | |
|---|---|---|---|---|
| 8,423,176 | B2* | 4/2013 | Ogi | H01L 21/67196 700/214 |
| 2003/0098125 | A1* | 5/2003 | An | H01L 21/31116 156/345.31 |
| 2006/0223334 | A1 | 10/2006 | Saki | |
| 2007/0184636 | A1 | 8/2007 | Takano | |
| 2009/0041926 | A1* | 2/2009 | Miyata | H01L 21/67276 118/712 |
| 2009/0098298 | A1* | 4/2009 | Miyata | H01L 21/67276 427/372.2 |
| 2009/0139657 | A1* | 6/2009 | Lee | H01J 37/32449 156/345.24 |
| 2012/0004753 | A1* | 1/2012 | Ogi | H01L 21/67253 700/100 |
| 2014/0083613 | A1* | 3/2014 | Xu | H01L 21/67017 156/345.33 |
| 2015/0027638 | A1* | 1/2015 | Kaneko | H01L 21/67276 156/345.54 |
| 2017/0287760 | A1* | 10/2017 | Yamamoto | B08B 1/001 |
| 2018/0203434 | A1* | 7/2018 | Nonobe | G05B 19/41865 |
| 2019/0271970 | A1* | 9/2019 | Nonobe | H01L 21/67173 |
| 2020/0089196 | A1* | 3/2020 | Ohashi | H01L 21/67196 |
| 2020/0243365 | A1* | 7/2020 | Matsuyama | G05B 19/41865 |

FOREIGN PATENT DOCUMENTS

| | | | |
|---|---|---|---|
| JP | 2011171490 A | * | 9/2011 |
| KR | 10-2010-0012192 A | | 2/2010 |
| KR | 10-2020-0138354 A | | 12/2020 |
| WO | 2005-112108 A1 | | 11/2005 |

OTHER PUBLICATIONS

Japanese Office Action issued on Oct. 25, 2022 for Japanese Patent Application No. 2021-054496.

Korean Office Action issued on Jun. 26, 2023 for Korean Patent Application No. 10-2021-0123847.

* cited by examiner

| Processing time | Recipe | Used gas type | Plasma generator |
|---|---|---|---|
| Process A | T1 | Recipe A | First gas<br>Second gas<br>Fourth gas | off |
| Process B | T2 | Recipe B | Third gas<br>Fourth gas | on |
| Process C | T3 | Recipe A | First gas<br>Second gas<br>Fourth gas | off |
| Process D | T4 | Recipe B | Third gas<br>Fourth gas | on |

| | Cumulative processing time | | | |
|---|---|---|---|---|
| | Process A | Process B | Process C | Process D |
| Reactor 200a | Aa | Ba | Ca | Da |
| Reactor 200b | Ab | Bb | Cb | Db |
| Reactor 200c | Ac | Bc | Cc | Dc |
| Reactor 200d | Ad | Bd | Cd | Dd |

METHOD OF PROCESSING SUBSTRATE, SUBSTRATE PROCESSING APPARATUS, RECORDING MEDIUM, AND MANUFACTURING SEMICONDUCTOR DEVICE

CROSS-REFERENCE TO RELATED APPLICATION

This application is based upon and claims the benefit of priority from Japanese Patent Application No. 2021-054496, filed on Mar. 29, 2021, the entire contents of which are incorporated herein by reference.

TECHNICAL FIELD

The present disclosure relates to a method of manufacturing a semiconductor device.

BACKGROUND

As an aspect of a substrate processing apparatus used in a semiconductor device manufacturing process, there is known, for example, an apparatus that includes a module having a plurality of reactors. In such an apparatus, different processes may be performed in the respective reactors. In that case, consecutive processing may be performed in which a process is performed in one reactor and then a process is performed in another reactor.

SUMMARY

In the apparatus that performs consecutive processing in different reactors as described above, the processing times are different in the respective reactors. Therefore, it is desirable that the throughput of the entire apparatus is enhanced by making it possible to perform efficient processing, for example, by not generating a long standby time when moving to the next reactor.

Some embodiments of the present disclosure provide a technique capable of enhancing process efficiency.

According to one aspect of the present disclosure, there is provided a technique that includes: receiving type information corresponding to substrate processing; reading the type information and processing time information corresponding to the type information from a memory; calculating a ratio of a processing time of a predetermined process to a total time of the processing time information; selecting one or more reactors according to the ratio; setting the one or more reactors to be capable of performing the predetermined process; transferring a substrate corresponding to the type information to the one or more reactors; and performing the predetermined process corresponding to the type information in the one or more reactors.

BRIEF DESCRIPTION OF DRAWINGS

The accompanying drawings, which are incorporated in and constitute a part of the specification, illustrate embodiments of the present disclosure.

The accompanying drawings, which are incorporated in and constitute a part of the specification, illustrate embodiments of the present disclosure.

FIG. 6 is a table held by a substrate processing apparatus according to embodiments.

FIG. 7 is a table held by a substrate processing apparatus according to embodiments.

DETAILED DESCRIPTION

Figure 1:
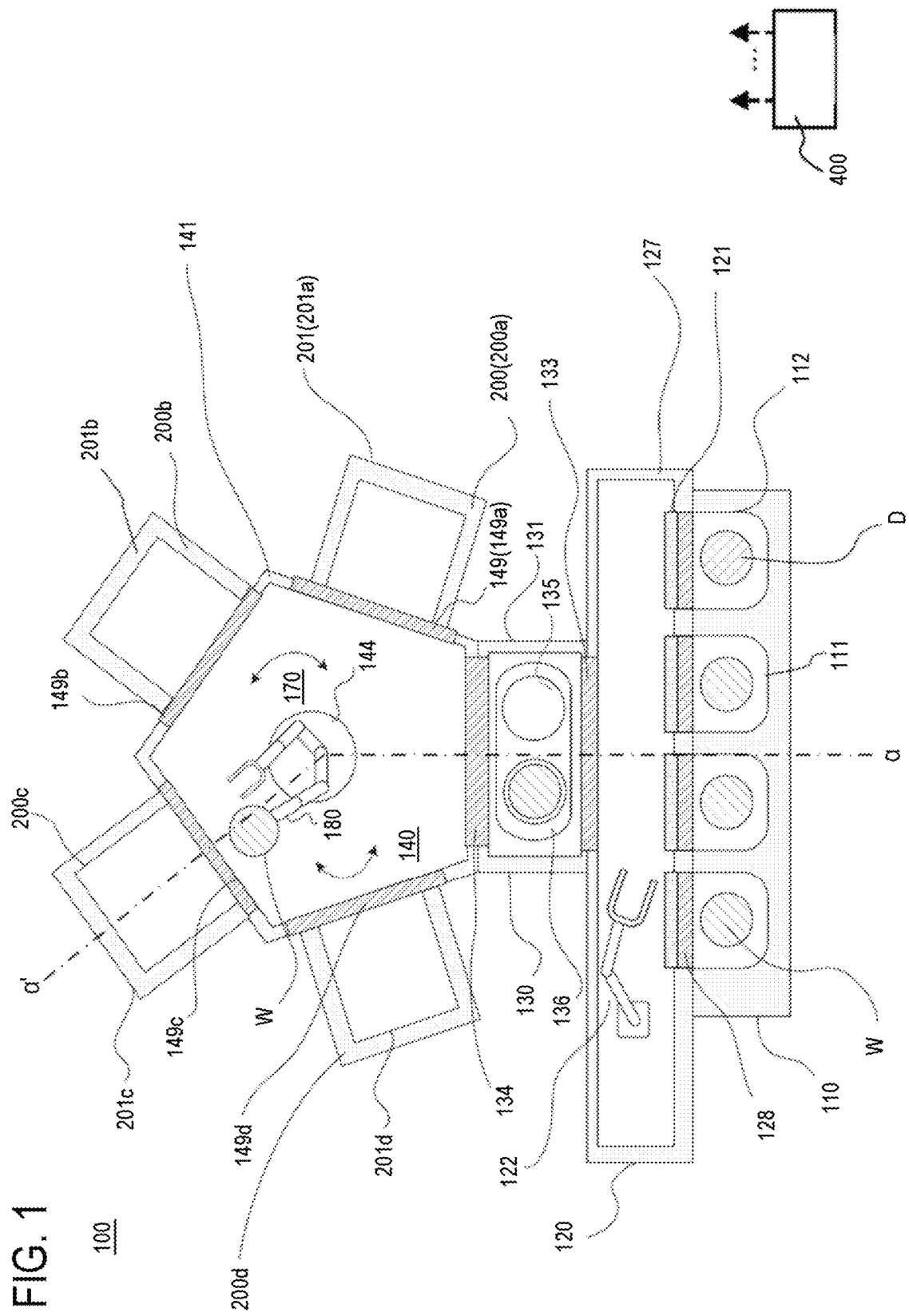
FIG. 1 is an explanatory diagram showing a schematic configuration example of a substrate processing apparatus according to embodiments.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings. The drawings used in the following description are all schematic. The dimensional relationship of the respective elements on the drawing, the ratio of the respective elements, and the like do not always match the actual ones. In addition, the dimensional relationship of the respective elements, the ratio of the respective elements, and the like do not always match even between the drawings.

First Embodiment (1) Configuration of Substrate Processing Apparatus

Figure 2:
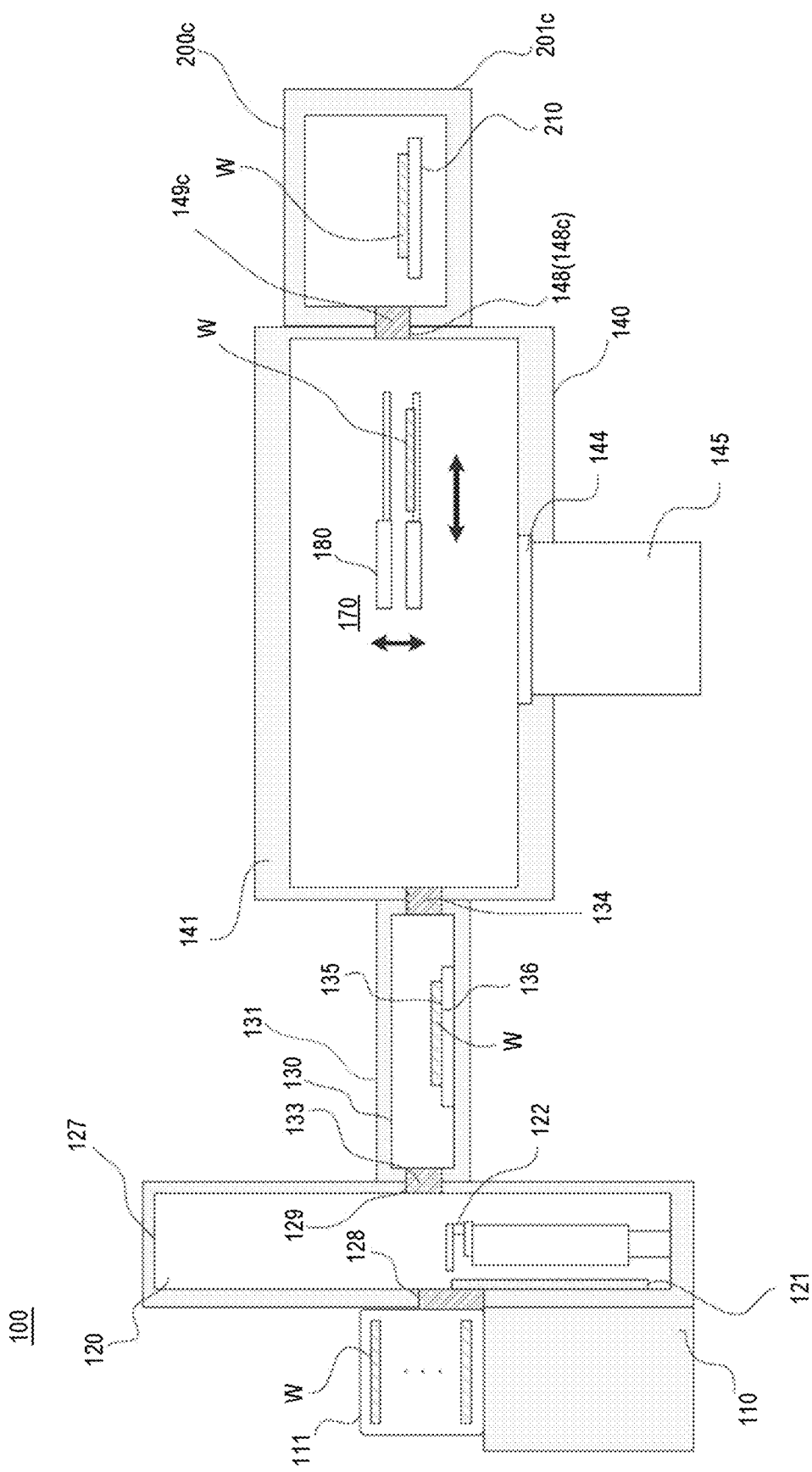
FIG. 2 is an explanatory diagram showing the schematic configuration example of the substrate processing apparatus according to embodiments.

The schematic configuration of a substrate processing apparatus according to embodiments of the present disclosure will be described with reference to FIGS. 1 and 2. FIG. 1 is a horizontal sectional view showing a configuration example of a substrate processing apparatus according to the embodiments of the present disclosure. FIG. 2 is a vertical sectional view taken along line α-α' in FIG. 1, showing the configuration example of the substrate processing apparatus according to the embodiments of the present disclosure.

Referring to FIGS. 1 and 2, the substrate processing apparatus 100 to which the present aspect is applied is an apparatus for processing a substrate W as a substrate, and mainly includes an IO stage 110, an atmospheric transfer chamber 120, a load lock chamber 130, a vacuum transfer chamber 140, and a reactor 200. Each configuration will be specifically described below.

The IO stage (load port) 110 is installed at a front side of the substrate processing apparatus 100. A plurality of pods 111 is mounted on the IO stage 110. The pods 111 are used as carriers for transferring substrates W such as silicon (Si) substrates or the like. Further, a dummy substrate storage 112 for storing dummy substrates D is provided.

The IO stage 110 is adjacent to the atmospheric transfer chamber 120. The atmospheric transfer chamber 120 is connected to the load lock chamber 130, which will be described later, at its surface opposite to the IO stage 110. An atmospheric transfer robot 122 for transferring a substrate W is installed in the atmospheric transfer chamber 120.

A substrate loading/unloading port 128 for loading and unloading the substrate W into and from the atmospheric transfer chamber 120, and a pod opener 121 are installed at a front side of a housing 127 of the atmospheric transfer chamber 120. A substrate loading/unloading port 129 for loading and unloading the substrate W into and from the load lock chamber 130 is installed at a rear side of the housing 127 of the atmospheric transfer chamber 120. The substrate loading/unloading port 129 enables loading and unloading of the substrate W by being opened and closed by a gate valve 133.

The load lock chamber 130 is adjacent to the atmospheric transfer chamber 120. The vacuum transfer chamber 140, which will be described later, is disposed at a surface, which is opposite to the atmospheric transfer chamber 120, among surfaces of a housing 131 constituting the load lock chamber 130. The vacuum transfer chamber 140 is connected to the load lock chamber 130 via a gate valve 134.

In the load lock chamber 130, there is installed a substrate mounting table 136 having at least two mounting surfaces 135 on which the substrates W are mounted. A distance between the substrate mounting surfaces 135 is set according to a distance between end effectors provided in arms of a robot 170, which will be described later.

The substrate processing apparatus 100 includes a vacuum transfer chamber 140 as a transfer chamber that serves as a transfer space into which the substrate W is transferred at a negative pressure. The housing 141 constituting the vacuum transfer chamber 140 is formed to have a pentagonal shape in a plane view. The load lock chamber 130 and reactors 200 (200a to 200d) for processing the substrate W are connected to ides of the pentagon, respectively. The transfer robot 170 as a transfer device for transferring the substrate W at a negative pressure is installed at a substantially central portion of the vacuum transfer chamber 140 with a flange 144 as a base.

The vacuum transfer robot 170 installed in the vacuum transfer chamber 140 is configured to be capable of being moved up and down by means of an elevator 145 and a flange 144 while maintaining the airtightness of the vacuum transfer chamber 140. Two arms 180 of the robot 170 are configured to be capable of being moved up and down by the elevator 145. In FIG. 2, for the sake of convenience of description, the end effectors of the arms 180 are shown, and structures of a robot shaft and the like connected to the flange 144 are omitted.

Reactors 200 (reactors 200a to 200d) are connected to an outer periphery of the vacuum transfer chamber 140. The reactors 200 are arranged radially around the vacuum transfer chamber 140.

Substrate loading/unloading ports 148 are installed at side walls facing the respective reactors 200 among the side walls of the housing 141. For example, as shown in FIG. 2, a substrate loading/unloading port 148c is installed at side wall facing the reactor 200c. Further, a gate valve 149 is installed for each reactor 200. For example, a gate valve 149c is installed at the reactor 200c. Since the reactors 200a, 200b and 200d have the same configuration as the reactor 200c, the description thereof will be omitted here.

Subsequently, the robot 170 installed in the vacuum transfer chamber 140 will be described. The robot 170 includes two arms 180. The arm 180 includes an end effector on which the substrate W is placed.

The elevator 145 controls elevating movement and rotation of the arm 180. The arm 180 is configured to be capable of rotating and extending with respect to an arm axis. The rotation and extension are performed load the substrate W into the reactor 200, and unload the substrate W from the reactor 200.

Next, the reactors 200a to 200d will be described. Since the reactors 200a to 200d have similar configuration, they will be described here as one reactor 200. Each reactor 200 is configured to be capable of performing a plurality of processes. Details will be described below.

Figure 3:
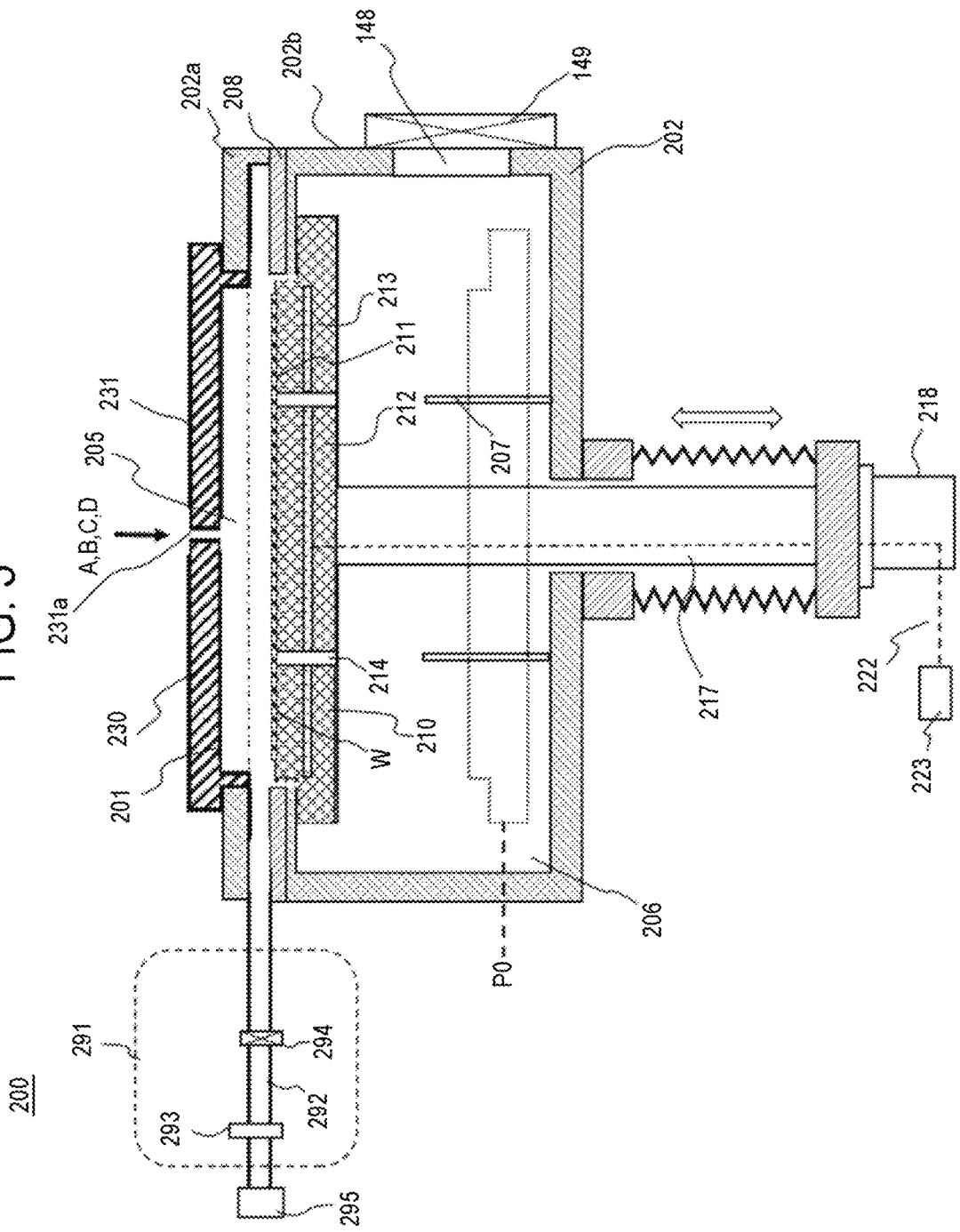
FIG. 3 is an explanatory diagram showing a schematic configuration example of a reactor according to embodiments.
Figure 4:
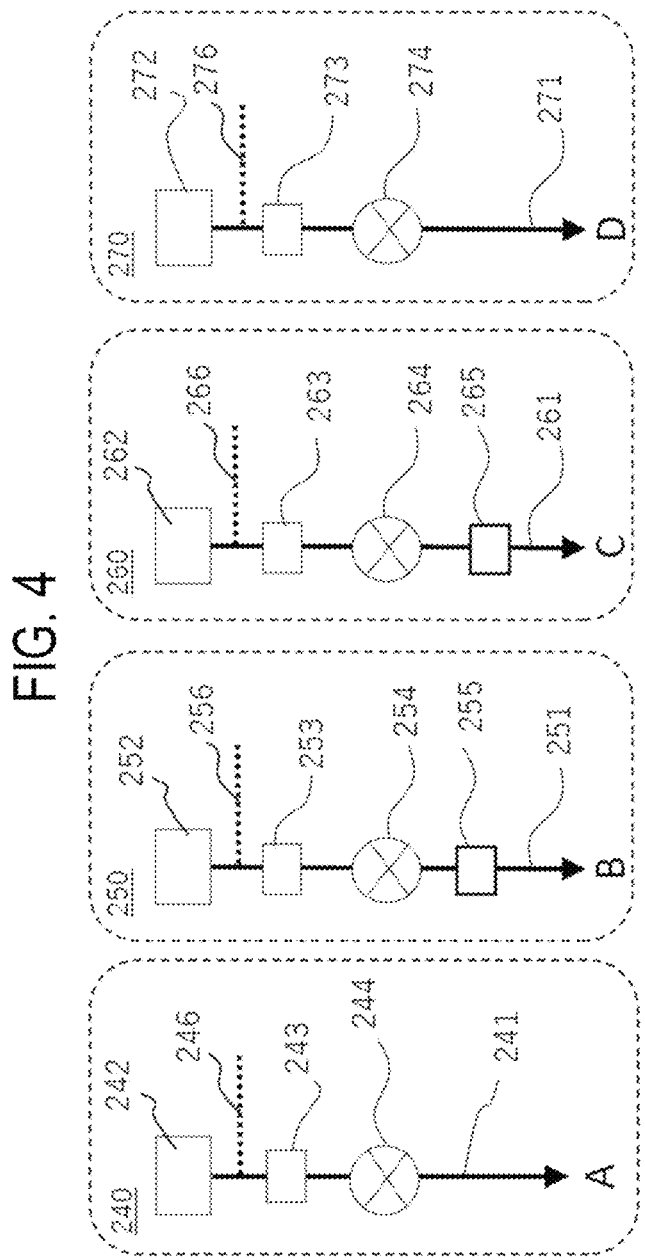
FIG. 4 is an explanatory diagram showing a schematic configuration example of a gas supplier according to embodiments.

The details of the reactor 200 will be described with reference to FIGS. 3 and 4. As shown in FIG. 3, the reactor 200 includes a container 202. The container 202 is configured as, for example, a flat sealed container having a circular horizontal cross section. Further, the container 202 is made of a metal material such as aluminum (Al) or stainless steel (SUS). In the container 202, there are formed a process chamber 201 constituting a process space 205 for processing a substrate W such as a silicon substrate or the like, and a transfer chamber 206 having a transfer space through which the substrate W passes when the substrate W is transferred to the process space 205. The container 202 is composed of an upper container 202a and a lower container 202b. A partition plate 208 is interposed between the upper container 202a and the lower container 202b.

A communication hole 148 adjacent to the gate valve 149 is installed at a side surface of the lower container 202b, and the substrate W is moved between the vacuum transfer chamber 140 and the lower container 202b via the communication hole 148. A plurality of lift pins 207 is installed at a bottom of the lower container 202b.

A substrate support 210 that supports the substrate W is arranged in the process space 205. The board support 210 mainly includes a substrate mounting surface 211 configured to mount the substrate W thereon, a substrate mounting table 212 having the substrate mounting surface 211 on a front surface thereof, and a heater 213 as a heating part installed in the substrate mounting table 212. In the substrate mounting table 212, through-holes 214 through which the lift pins 207 pass are formed at positions corresponding to the lift pins 207, respectively.

A wiring 222 for supplying electric power is connected to the heater 213. The wiring 222 is connected to a heater controller 223. The heater controller 223 is electrically connected to a controller 400. The controller 400 controls the heater controller 223 to operate the heater 213.

The substrate mounting table 212 is supported by a shaft 217. The shaft 217 passes through the bottom of the container 202 and is connected to the elevator 218 outside the container 202.

By operating the elevator 218 to move the shaft 217 and the substrate mounting table 212 up or down, the substrate mounting table 212 can move the substrate W mounted on the substrate mounting surface 211 up or down.

The process chamber 201 is composed of, for example, a buffer structure 230 to be described later and a substrate mounting table 212. The process chamber 201 may be configured by other structures as long as the process space 205 for processing the substrate W can be secured.

When transferring the substrate W, the substrate mounting table 212 moves down to a transfer position P0 at which the substrate mounting table 212 faces the communication hole 148. When processing the substrate W, the substrate mounting table 212 moves up until the substrate W reaches a processing position in the process space 205, as shown in FIG. 1.

A buffer structure 230 for diffusing a gas is installed above (at an upstream side of) the process space 205. The buffer structure 230 is mainly composed of a lid 231. A first gas supplier 240, a second gas supplier 250, a third gas supplier 260, and a fourth gas supplier 270, which will be described later, are connected to the lid 231 so as to communicate with a gas introduction hole 231a installed at the lid 231. Although only one gas introduction hole 231a is shown in FIG. 3, a gas introduction hole may be installed for each gas supplier.

Subsequently, an exhauster 291 will be described. An exhaust pipe 292 communicates with the process space 205. The exhaust pipe 292 is connected to the upper container 202a so as to communicate with the process space 205. An APC 293, which is a pressure controller that controls the inside of the process space 205 to a predetermined pressure, is installed at the exhaust pipe 292. The APC 293 has a valve body (not shown) whose opening degree can be adjusted, and adjusts a conductance of the exhaust pipe 292 in response to an instruction from the controller 400. Further, a valve 294 is installed at the exhaust pipe 292 in an upstream side of the APC 273. The exhaust pipe 292, the valve 294 and the APC 293 are collectively referred to as an exhauster.

Further, a DP (Dry Pump) 295 is installed at a downstream side of the exhaust pipe 292. The DP 295 exhausts an atmosphere of the process space 205 through the exhaust pipe 292.

Next, the gas suppliers for supplying gases to the process chamber 201 will be described with reference to FIG. 4. First, a first gas supplier 240 will be described. A first gas source 242, an MFC 243, which is a flow rate controller (flow rate control part), and a valve 244, which is an opening/closing valve, are installed at a first gas supply pipe 241 sequentially from an upstream side.

The first gas source 242 is a source of a first gas containing a first element (also referred to as "first element-containing gas"). The first element-containing gas is a precursor gas, that is, one of the processing gases. Here, the first element is, for example, silicon (Si). That is, the first gas is, for example, a silicon-containing gas. Specifically, a hexachlorodisilane ($Si_2Cl_6$, HCDS) gas is used as the silicon-containing gas.

A bypass pipe 246 may be installed at the first gas supply pipe 241. The bypass pipe 246 is used when the first gas is not supplied to the process chamber 201. For example, the valve 244 is closed and a second gas moves to the bypass pipe 246. The bypass pipe 246 is connected to the exhaust pipe 292, and the gas supplied to the bypass pipe 246 is exhausted from the exhaust pipe 292.

The first gas supplier 240 is mainly constituted by the first gas supply pipe 241, the MFC 243 and the valve 244. The bypass pipe 246 may be included in the first gas supplier 240.

The second gas supplier 250 will be described. A second gas source 252, an MFC 253, which is a flow rate controller (flow rate control part), and a valve 254, which is an opening/closing valve, are installed at a second gas supply pipe 251 sequentially from an upstream side.

The second gas source 252 is a source of a second gas containing a second element (hereinafter also referred to as "second element-containing gas"). The second element-containing gas is one of a processing gas. The second gas may be considered as a reaction gas or a modifying gas.

Here, the second gas contains a second element different from the first element. The second element is, for example, one of oxygen (O), nitrogen (N), and carbon (C). In the present embodiments, the second element-containing gas will be described as, for example, a nitrogen-containing gas. Specifically, an ammonia ($NH_3$) gas is used as the nitrogen-containing gas.

A remote plasma unit (RPU) 255 may be installed at the second gas supply pipe 251. The RPU 255 is configured to covert the second gas passing through the second gas supply pipe 251 into a plasma state.

A bypass pipe 256 may be installed at the second gas supply pipe 251. The bypass pipe 256 is used when the second gas is not supplied to the process chamber 201. For example, the valve 254 is closed and the second gas moves to the bypass pipe 256. The bypass pipe 256 is connected to the exhaust pipe 292, and the gas supplied to the bypass pipe 256 is exhausted from the exhaust pipe 292.

The second gas supplier 250 is mainly constituted by the second gas supply pipe 251, the MFC 253 and the valve 254. The RPU 255 may be included in the second gas supplier 250. Further, the bypass pipe 256 may be included in the second gas supplier 250.

When forming a film on the substrate W by using the first gas alone, it is not necessary to install the second gas supplier 250.

The third gas supplier 260 will be described. A third gas source 262, an MFC 263, which is a flow rate controller (flow rate control part), and a valve 264, which is an opening/closing valve, are installed at a third gas supply pipe 261 sequentially from an upstream side.

The third gas source 262 is a source of a third gas containing a third element (hereinafter also referred to as "third element-containing gas"). The third element-containing gas is one of a reaction gas that reacts with the film formed by using the first gas and the second gas. The third gas may be considered as a modifying gas.

Here, the third element is, for example, one of oxygen (O), nitrogen (N), carbon (C), and hydrogen (H). Here, the third element-containing gas will be described as, for example, a hydrogen-containing gas. Specifically, a hydrogen ($H_2$) gas is used as the hydrogen-containing gas.

A remote plasma unit (RPU) 265 may be installed at the third gas supply pipe 261. The RPU 265 is configured to covert the third gas passing through the third gas supply pipe 261 into a plasma state.

Further, a bypass pipe 266 may be installed at the third gas supply pipe 261. The bypass pipe 266 is used when the third gas is not supplied to the process chamber 201. For example, the valve 264 is closed and the third gas moves to the bypass pipe 266. The bypass pipe 266 is connected to the exhaust pipe 292, and the gas supplied to the bypass pipe 266 is exhausted from the exhaust pipe 292.

The third gas supplier 260 is mainly constituted by the third gas supply pipe 261, the MFC 263, and the valve 264. The RPU 265 may be included in the third gas supplier 260. Further, the bypass pipe 266 may be included in the third gas supplier 260.

The fourth gas supplier 270 will be described. A fourth gas source 272, an MFC 273, which is a flow rate controller (flow rate control part), and a valve 274, which is an opening/closing valve, are installed at a fourth gas supply pipe 271 sequentially from an upstream side.

The fourth gas source 272 is a source of an inert gas. The inert gas is a gas that does not react with the film formed on the substrate W, and is, for example, a nitrogen ($N_2$) gas.

Further, a bypass pipe 276 may be installed at the fourth gas supply pipe 271. The bypass pipe 276 is used when the fourth gas is not supplied to the process chamber 201. For example, the valve 274 is closed and a fourth gas moves to the bypass pipe 276. The bypass pipe 266 is connected to the exhaust pipe 292, and the gas supplied to the bypass pipe 276 is exhausted from the exhaust pipe 292.

The fourth gas supplier 270 is mainly constituted by the fourth gas supply pipe 271, the MFC 273 and the valve 294. Further, the bypass pipe 276 may be included in the fourth gas supplier 270.

As will be described later, in the present embodiments, a film is formed on the substrate W by using the first gas and the second gas, and the formed film is modified by using the third gas. The inert gas is used for exhausting an internal atmosphere of the process chamber 201.

Each configuration is selectively operated according to the process type selected by a process selector 408 described later. For example, when the process selector 408 selects a process A to be performed in the reactor 200, the first gas supplier 240, the second gas supplier 250 and the like, which are components related to the process A, are operated to supply gases into the process chamber 201. Further, the operation of the third gas supplier 260 is stopped such that the third gas does not affect the process A, or the third gas is exhausted via the bypass pipe 266 such that the third gas does not enter the process chamber 201. In this regard, the stop of the operation of each gas supplier includes merely keeping the opening/closing valve closed.

Further, for example, when the process selector 408 to be described later selects the process B to be performed in the reactor 200, the third gas supplier 260, which is a component related to the process B, is operated to supply a gas into the process chamber 201. Further, the operations of the first gas supplier 240 and the second gas supplier 250 are stopped such that the first gas and the second gas do not affect the process B, or the first gas and the second gas are exhausted via the bypass pipe 246, the bypass pipe 256 and the like such that the first gas and the second gas do not enter the process chamber 201.

Figure 5:
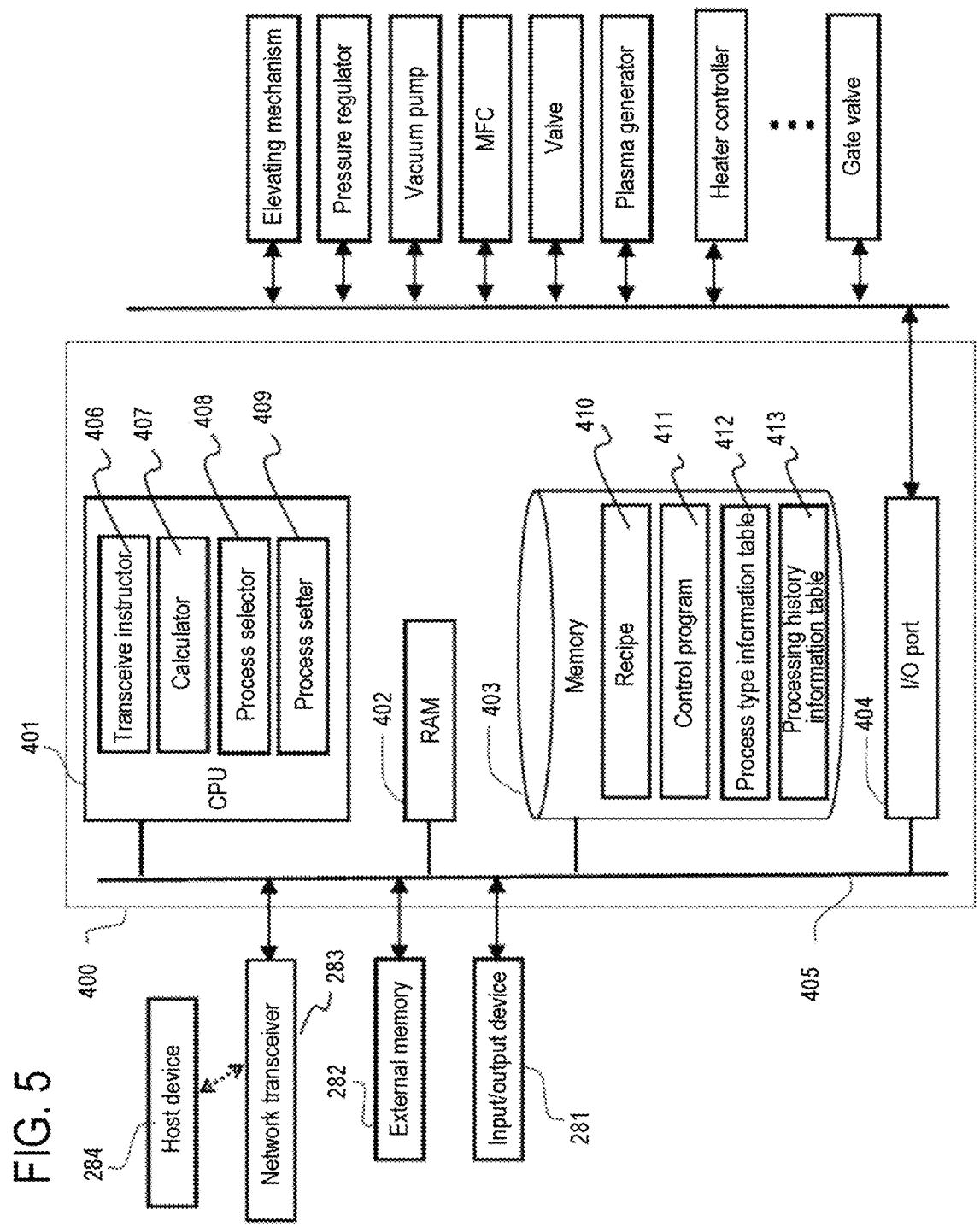
FIG. 5 is an explanatory diagram illustrating a controller of a substrate processing apparatus according to embodiments.

Next, the controller 400 will be described with reference to FIG. 5. The substrate processing apparatus 100 includes a controller 400 that controls the operation of each part.

The controller 400, which is a control part (control means), is configured as a computer that includes a CPU (Central Processing Unit) 401, a RAM (Random Access Memory) 402, a memory 403 as a storage device and an I/O port 404. The RAM 402, the memory 403 and the I/O port 404 are configured to exchange data with the CPU 401 via an internal bus 405. The transmission and reception of data in the substrate processing apparatus 100 are performed according an instruction of a transceive instructor 406, which is also one function of the CPU 401.

The CPU 401 is configured to read a control program from the memory 403 and execute the same, and is configured to read a process recipe from the memory 403 in response to an input of an operation command from the input/output device 281. The CPU 401 is configured to be able to control the opening/closing operation of the gate valve 149, the elevating operation of the elevating mechanism 218, the operation of the heater controller 223, the on/off operation of each pump, the flow rate adjustment operation of the MFC, the operation of the valve and the like so as to follow the contents of the read process recipe.

The CPU 401 further includes a calculator 407, a process selector 408 and a process setter 409. These configurations will be described later.

The memory 403 is composed of, for example, a flash memory, an HDD (Hard Disk Drive), or the like. In the memory 403, there are readably stored a recipe 410 composed of a process recipe or the like in which procedure and conditions of a substrate processing process are described, and a control program 411 that controls the operation of the substrate processing apparatus. Further, the memory 403 stores a process type information table 412 and a processing history information table 413. The process type information may be simply referred to as type information.

The process recipe is a combination that causes the controller 400 to execute each procedure in the below-described substrate processing process to obtain a predetermined result. The process recipe functions as a program. Hereinafter, the process recipe, the control program and the like are collectively and simply referred to as a program. When the term "program" is used herein, it may include only a process recipe, only a control program, or both. Further, the RAM 402 is configured as a memory area (work area) in which programs, data and the like read by the CPU 401 are temporarily held.

The I/O port 404 is connected to the respective components such as the gate valve 149, the elevating mechanism 218, the respective pressure regulators, the respective pumps, and the heater controller 223.

Further, a network transceiver 283 connected to a host device 284 via a network is provided. The network transceiver 283 may receive information on a processing history and a processing schedule of the substrates W belonging to a lot.

The process type information table 412 will be described with reference to FIG. 6. The process type information table 412 is a table that stores a plurality of process types, the corresponding processing times, the corresponding process recipes, and the like.

The process type information refers to process information with respect to the substrate W. As the processes, there are, for example, a process A using the first gas and the second gas, and a process B using the third gas. In addition, there are a process C, a process D and the like, which are similar in content to the process A and the process B, respectively, but have different processing times. As a specific example of the process type information, there is stored information on the processing time, the process recipe, and the processing gas. Here, four processes have been described by way of example. However, it may not be limited thereto. Information on five or more process types may be stored.

Referring to FIG. 6, in the process A, the processing time is set to T1, a recipe A is used, a Si-containing gas is used as the first gas, and a N-containing gas is used as the second gas. Under such a condition, in the process A, a SiN film is formed on the substrate. The process C is different from the process A in terms of the processing time. The processing time in the process C is set to T3.

Further, in the process B, the processing time is set to T2, a recipe B is used, and a hydrogen-containing gas is used as the third gas. Further, the plasma generator is in an ON state. The process B is a process which is continuously performed after the process A. Under such a condition, the SiN film formed in the process A is modified by the third gas. The process D is different from the process B in terms of the processing time. In the process D, the processing time is set to T4.

The processing time referred to therein means, for example, a time taken from a time at which the substrate W is loaded into the reactor 200 to a time at which the substrate W is unloaded from the reactor 200 after going through each process. In the flow of the process A shown in FIG. 9, which will be described later, the processing time means a time from the start of a substrate loading step S302 to the end of a substrate unloading step S306. In the flow of the process B shown in FIG. 10, which will be described later, the processing time means a time taken from the start of a substrate loading step S402 to the end of a substrate unloading step S406. Since the process C and the process D have the same idea, the description thereof will be omitted here.

The recipe information refers to information including a processing sequence of each process. The processing sequence also includes the order of operations of the respective components, the operation time thereof, and the like. In FIG. 6, the recipe information and the used gas type information are shown separately. However, the used gas type information may be included in the recipe information.

Subsequently, the calculator 407, the process selector 408 and the process setter 409 included in the CPU 401 will be described. The calculator 407 has a function of calculating a ratio of a processing time of a predetermined process to a total processing time taken in the continuous processing. For example, when there are the process A and the process B, the calculator 407 calculates a ratio of a processing time of the process B among them.

The process selector 408 selects a process to be performed by each reactor from the process type information stored in the process type information table 412. For example, the process A to be performed in the reactor 200a, the reactor 200b, and the reactor 200c is selected. The process B to be performed in the reactor 200d is selected.

The process setter 409 reads out recipe information corresponding to the process selected by the process selector 408 for each reactor 200, and sets the components and the like in each reactor 200.

Subsequently, the processing history information table 413 will be described with reference to FIG. 7. The processing history information table 413 stores processing history information of each process corresponding to each reactor 200. For example, information Aa, which is information on a cumulative processing time of the process A in the reactor 200a, is stored, and information Bc, which is information on a cumulative processing time of the process B in the reactor 200c, is stored. These are updated in the processing history recording step S214 to be described later.

The controller 400 according to the present technique can be configured by installing a program in a computer using an external memory device (e.g., a magnetic disk such as a hard disk or the like, an optical disk such as a DVD or the like, a magneto-optical disk such as a MO or the like, or a semiconductor memory such as a USB memory or the like) 282 that stores the program. The means for supplying the program to the computer is not limited to the case of supplying the program via the external memory device 282. For example, a communication means such as the Internet or a dedicated line may be used to supply the program without going through the external memory device 282. The memory 403 and the external memory device 282 are configured as a computer-readable recording medium. Hereinafter, these are collectively and simply referred to as a recording medium. When the term "recording medium" is used herein, it may refer to a case of including only the memory 403, a case of including only the external memory device 282, or a case of including both.

(2) Substrate Processing Process

Figure 8:
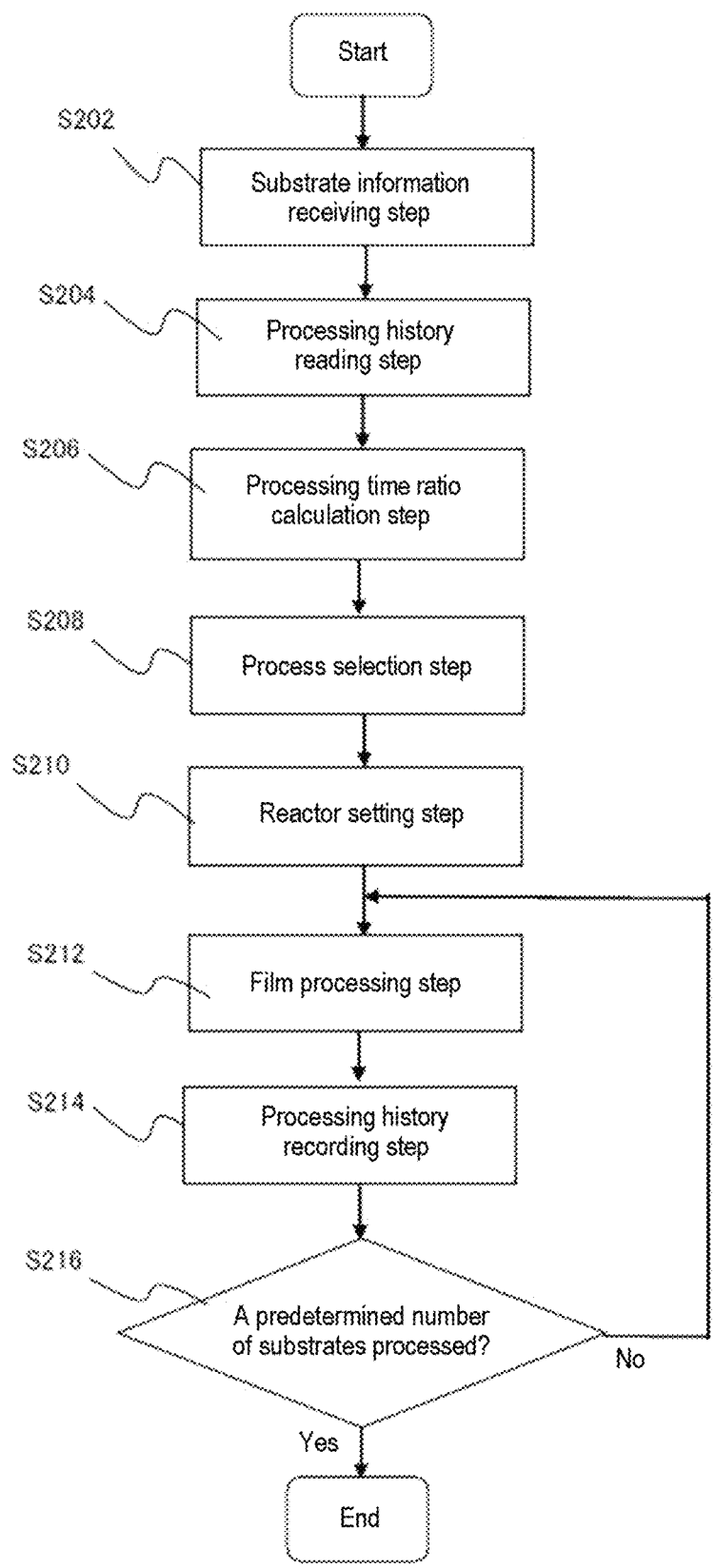
FIG. 8 is an explanatory diagram illustrating a substrate processing flow according to embodiments.

Next, the substrate processing process will be described with reference to FIG. 8. As one process performed by the substrate processing apparatus, a process of processing the substrate W using the substrate processing apparatus 100 as configured above will be described. In the following description, the operation of each part constituting the substrate processing apparatus is controlled by the controller 400.

(Substrate Information Receiving Step S202)

A substrate information receiving step S202 will be described. The substrate processing apparatus 100 receives a FOUP including a plurality of substrates W from a robot in a factory. Further, the substrate processing apparatus 100 receives the process type information for the substrates W from the host device 284. That is, the substrate processing apparatus 100 receives information on how to process the substrate W. Here, the substrate processing apparatus 100 receives, for example, information related to the process type information shown in FIG. 6. Specifically, the process type information is information on a case of performing only the process A on the substrate W, a case of performing the process A and the process B consecutively, a case of performing the process C and the process D consecutively, and the like.

(Processing History Reading Step S204)

A processing history reading step S204 will be described. The processing history of each reactor 200 is read from the processing history information table 413. Specifically, for example, when the process A and the process B are performed with respect to the substrate W, the cumulative processing time of each of the process A and the process B is read out. For example, Aa to Ad, which is the cumulative processing time of the process A of each reactor 200, is read out, and Ba to Bd, which is the cumulative processing time of the process B, is read out. By reading out the cumulative processing time, it is possible to grasp the state of each reactor 200. The state of each reactor 200 refers to, for example, a film thickness of a by-product adhering to the inner wall of the reactor 200 and the like.

(Processing Time Ratio Calculation Step S206)

A processing time ratio calculation step S206 will be described. Based on the process type information received in the substrate information receiving step S202, the processing time information of each process is read out. Further, a ratio of a processing time of a predetermined process to a total time of the processing time information of the process to be performed from now is calculated. For example, when only the process A is performed, a ratio of the process A is calculated as 100%. When the process A and the process B are performed consecutively, a ratio of the processing time of the process A and the process B is calculated. For example, as for the processing time (arbitrary unit), if the process A is 0.5 and the process B is 1.5, it is calculated that the processing time ratio is 1:3. Further, if the process A is 1.5 and the process B is 0.5, it is calculated that the processing time ratio is 3:1. The processing time referred to herein means, for example, a time from the start of loading the substrate W into the reactor 200 to the end of unloading the substrate W.

(Process Selection Step S208)

A process selection step S208 will be described. The process selector 408 determines the number of reactors 200 corresponding to each process based on the ratio calculated in the processing time ratio calculation step S206. For example, if the ratio of the processing time of the process A and the process B is 1:3, one reactor 200 corresponding to the process A and three reactors 200 corresponding to the process B are selected. If the ratio of the processing time of the process A and the process B is 3:1, three reactors 200 corresponding to the process A and one reactor 200 corresponding to the process B are selected.

In the present embodiments, as the ratio of the processing time of the process A and the process B of 3:1, for example, the reactor 200a, the reactor 200b and the reactor 200c are selected as the reactor 200 corresponding to the process A. Further, the reactor 200d is selected as the reactor 200 corresponding to the process B.

Desirably, by the following reason, in this step, the reactor 200 is selected by referring to the cumulative processing time of each process in each reactor 200 read in the processing history reading step S204.

For example, if the cumulative processing time of components is uneven among the reactors, there is a case that a processing condition of the substrate is also uneven. Therefore, in order to prevent the processing history of the reactor 200 from being uneven, the reactor 200 is selected such that the processing time becomes uniform.

In this regard, the unevenness of the processing condition of the substrate includes a difference in a use time of the component installed at each reactor, a difference in a surface state of a member in the process chamber 201 of each reactor 200, and the like. Due to the difference in the use time of the component, there may be a case that a difference in an amount of a gas supplied to the substrate W or a temperature of the substrate W occur even under the same processing condition. By making the processing history of each reactor 200 uniform, it is possible to improve the processing uniformity in each reactor.

In addition, the processing uniformity of each substrate W processed in the same reactor can be improved. For example, in the process chamber 201 at which the processing time of the modifying process is much, it is may be considered that a surface of a member in the process chamber 201 is modified by a gas used in the modifying process. When the surface of the member in the process chamber 201 is modified, an amount of the processing gas consumed in the process chamber 201 may be changed. As the amount of the processing gas consumed in the process chamber 201 is changed, an amount of the processing gas supplied to the substrate W may be changed. As a result, there may be a possibility that the processing uniformity of each substrate W is changed. The amount of the processing gas consumed in the process chamber 201 varies depending on the amount of the processing gas adsorbed to the surface of the member in the process chamber 201. By controlling the processing history of the reactor 200 so as not to become uneven, it is possible to improve not only the uniformity of the processing time but also the processing uniformity for each reactor and the processing uniformity for each substrate.

(Reactor Setting Step S210)

A reactor setting step S210 will be described. In each reactor 200, the operation and the like of each component are set based on the information of the process type information table 412 such that the process selected in the process selection step S208 can be performed. For example, in the reactors that performs the process A, the first gas supplier and the second gas supplier are set to be operable, and the third gas supplier and the plasma generator are set to be inoperable. In the reactor that performs the process B, the third gas supplier and the plasma generator are set to be operable, and the first gas supplier and the second gas supplier are set to be inoperable.

(Film-Processing Step S212)

A film-processing step S212 will be described. The substrate W is moved to each reactor 200. In each reactor 200, the film formed on the substrate W is processed. In each reactor 200, the process set according to the process type setting step S208 is executed. Details of this step will be described later.

(Processing History Recording Step S214)

A processing history recording step S214 will be described. When each process is completed, the processing time corresponding to the process type for each reactor 200 is recorded in the processing history information table 413. This step is not limited to being performed after the film-processing step S212, and may be performed in parallel with other steps.

(Determination step S216)

A determination step S216 will be described. In this step, it is determined whether or not a predetermined number of substrates W have been processed. When it is determined that the predetermined number of substrates W have been processed, it is considered that the processing for substrates of one lot has been completed and the processing is terminated. When the processing for the predetermined number of substrates is not completed, the substrate W to be processed next is transferred. After the processing is completed, for example, the processing for substrates W of the next lot is started.

Figure 9:
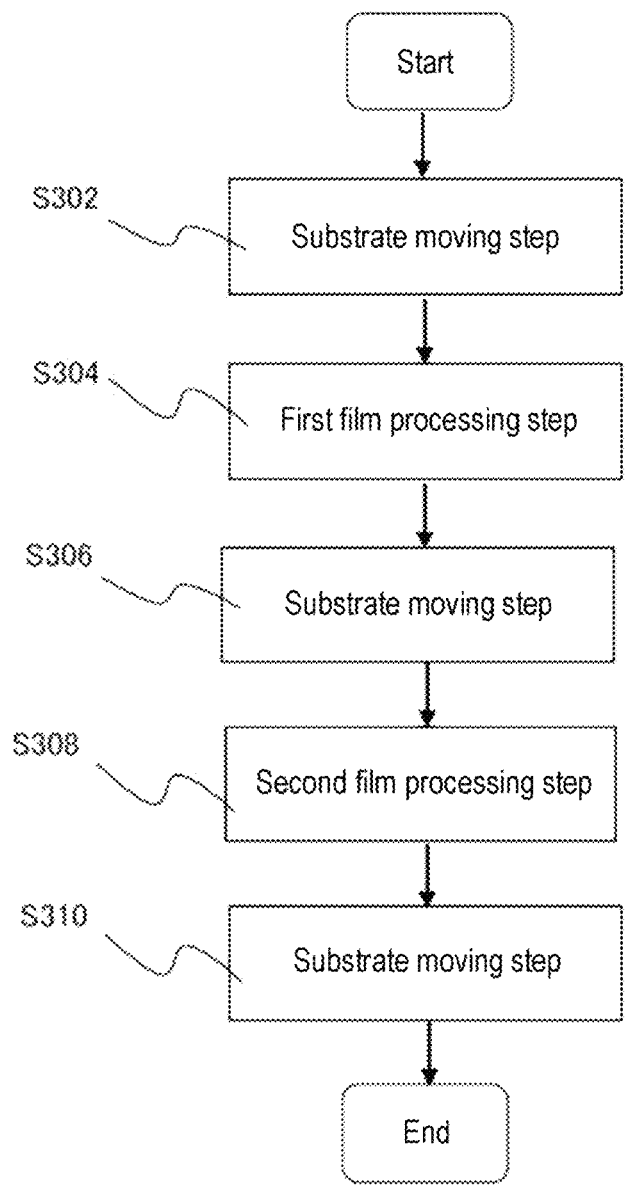
FIG. 9 is an explanatory diagram illustrating a substrate processing flow according to embodiments.
Figure 10:
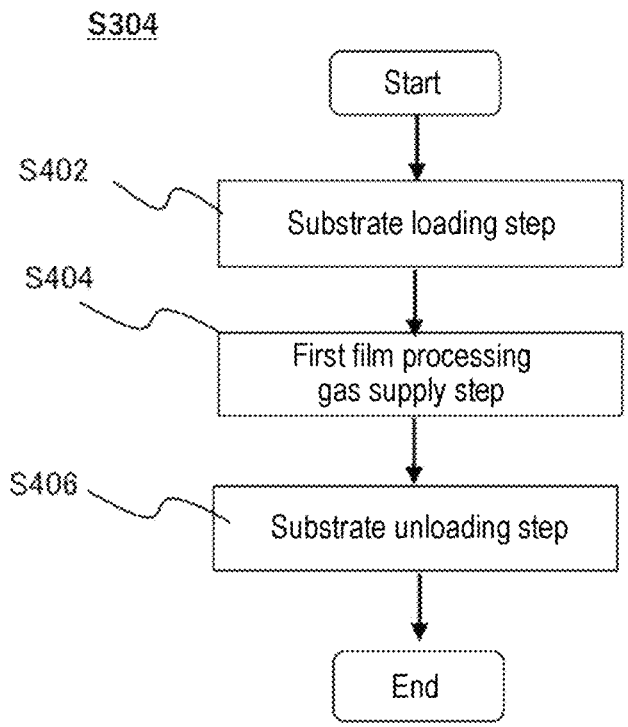
FIG. 10 is an explanatory diagram illustrating a substrate processing flow according to embodiments.

Subsequently, the details of the film processing step S212 will be described with reference to FIG. 9. FIG. 9 illustrates a processing flow for one substrate W. This is a flow showing an operation for one substrate W. For example, this is a flow in which the process A is performed and then the process B is performed.

(Substrate Moving Step S302)

A substrate moving step S302 will be described. The robot 170 moves the substrate W from the vacuum transfer chamber 140 to the selected reactor 200. Since the process A is performed first, the substrate W is moved to the reactor 200 which has been set to perform the process A. For example, the substrate is moved to the reactor 200a which has been set to perform the process A. In the reactor 200a, the gate valve 149 is opened, and the substrate W is loaded by the arm 180.

(First Film Processing Step S304)

A first film processing step S304 will be described. In the first film processing step S304, the substrate W is processed in the reactor 200 which has been set to perform the processing A. The specific contents will be described with reference to the flow shown in FIG. 10.

(Substrate Loading Step S402)

A substrate loading step S402 will be described. In the moving step S302, the substrate W is loaded into the reactor 200. For example, the substrate W is loaded into the reactor 200a.

At this time, the substrate mounting table 212 is lowered to a substrate transfer position (transfer position P0), and the lift pins 207 are allowed to pass through the through-holes 214 of the substrate mounting table 212. As a result, the lift pins 207 come into a state in which they protrude from the surface of the substrate mounting table 212 by a predetermined height. In parallel with these operations, the supply of the inert gas from the fourth gas supplier and the exhaust of the atmosphere of the transfer chamber 206 are performed so that the pressure in the transfer chamber 206 becomes equal to or lower than the pressure in an adjacent vacuum transfer chamber 140.

Subsequently, the gate valve 149 is opened to allow the transfer chamber 206 to communicate with the adjacent vacuum transfer chamber 140. Then, the robot 170 loads the substrate W from the vacuum transfer chamber 140 into the transfer chamber 206 and places the substrate W on the lift pins 207.

When the substrate W is mounted on the lift pins 207, the substrate mounting table 212 is raised to mount the substrate W on the substrate mounting surface 211 and then further raised to a substrate processing position as shown in FIG. 3.

When the substrate W is mounted on the substrate mounting surface 211, an electric power is supplied to the heater 213 so as to control that the surface of the substrate W becomes a predetermined temperature.

During the substrate loading step S402, each component is controlled by the setting of the process A. For example, the heater 213, the gas supply system, the exhaust system and the like are controlled.

(First Film Processing Gas Supply Step S404)

A first film processing gas supply step S404 will be described. In this step, each component is controlled with operations set in the reactor setting step S210 to process the film on the substrate W.

First, the pressure in the process chamber is regulated according to the recipe of the process A. For example, the exhauster 291 and the fourth gas supplier 270 are operated. When a desired pressure is reached, the first gas supplier 240 and the second gas supplier 250 are controlled to supply the first gas and the second gas into the process chamber 201 to process the substrate W. The processing in this step refers to, for example, processing of forming a predetermined film on the substrate W by reacting the first gas with the second gas. Further, in this step, the plasma generator 255 may be operated according to the recipe. In the present embodiments, an HCDS gas is supplied as the first gas and an $NH_3$ gas is supplied as the second gas to form a silicon nitride (SiN) film.

An example of a processing condition in this step is described as follows.

First gas: HCDS
Gas supply amount of first gas: 5 to 5,000 sccm
Second gas: $NH_3$
Gas supply amount of second gas: 10 to 10,000 sccm
Process chamber pressure: 133 to 13,332 Pa
Processing temperature: 300 to 500 degrees C.

After a predetermined time has elapsed, the first gas supplier 240 and the second gas supplier 250 are stopped.

Further, an inert gas is supplied from the fourth gas supplier to exhaust the atmosphere in the process chamber 201.

In this step, for example, the operation of the third gas supplier 260 is stopped such that the third gas is not supplied to the process chamber 201. Further, in order to prevent the third gas from being supplied, for example, the valve 264 may be closed and the third gas is discharged from the bypass pipe 266.

(Substrate Unloading Step S406)

A substrate unloading step S406 will be described. When the desired processing has been performed on the substrate W, the substrate W is unloaded from the process chamber in the reverse order of the substrate loading step S402. At this time, the substrate W is supported by the robot 170.

(Substrate Moving Step S306)

A substrate moving step S306 will be described. The robot 170 moves the substrate W to the next reactor 200. For example, when the process A and the process B are consecutively performed, the substrate W is moved to the reactor 200 which has been set to perform the process B, so as to perform the process B that is the next process. For example, the substrate W is moved to the reactor 200d. In the reactor 200d, the gate valve 149 is opened, and the arm 180 that supports the substrate W enters the reactor 200d.

(Second Film Processing Step S308)

Figure 11:
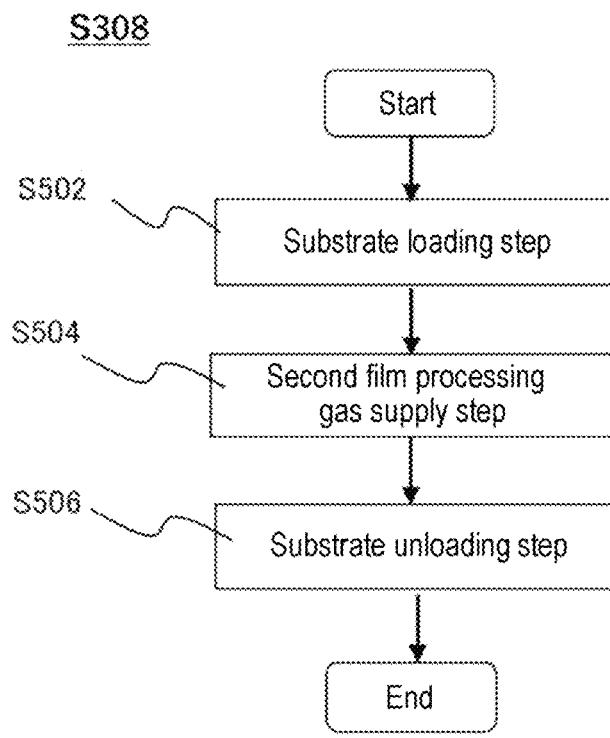
FIG. 11 is an explanatory diagram illustrating a substrate processing flow according to embodiments.

A second film processing step S308 will be described. In the second film processing step S308, the substrate W is processed in the reactor 200 which has been set to perform the process B. The specific contents will be described with reference to the flow shown in FIG. 11.

(Substrate Loading Step S502)

A substrate loading step S502 will be described. In this step, the substrate W is loaded in in the same manner as in the substrate loading step S402. The loaded substrate W is moved to the substrate processing position. During the substrate loading step S502, each component is controlled according to the setting of the process B. For example, the heater 213, the gas supply system, the exhaust system and the like are controlled.

(Second Film Processing Gas Supply Step S504)

A second film processing gas supply step S504 will be described. In this step, each component is controlled with operations set in the reactor setting step S210 to process the film on the substrate W.

First, the pressure in the process chamber is regulated according to the recipe of the process B. For example, the exhauster 291 and the fourth gas supplier 270 are operated. When a desired pressure is reached, the third gas supplier 260 is controlled to supply the third gas into the process chamber 201 to process the film on the substrate W. The film processing refers to, for example, processing of modifying the film formed in the first film processing step S304 with the third gas. Further, in this step, the plasma generator 265 may be operated according to the recipe. In the present embodiments, it refers to processing of supplying an $H_2$ gas to modify the SiN film formed in the process A.

An example of processing condition in this step is described as follows.

Third gas: $H_2$
Gas supply amount of third gas: 10 to 500 sccm
Process chamber pressure: 133 to 6,666 Pa
Process temperature: 100 to 600 degrees C.

After a predetermined time has elapsed, the third gas supplier 260 is stopped. Further, an inert gas is supplied from the fourth gas supplier to exhaust the atmosphere in the process chamber 201.

In this step, for example, the operations of the first gas supplier 240 and the second gas supplier 250 are stopped such that the first gas and the second gas are not supplied to the process chamber 201. Further, in order to prevent the supply of the first gas and the second gas, for example, the valve 244 and the valve 254 may be closed, and the first gas and the second gas may be discharged from the bypass pipes 246 and 256.

(Substrate Unloading Step S506)

A substrate unloading step S506 will be described. When the desired processing has been performed on the substrate W, the substrate W is unloaded from the process chamber 201 in the reverse order of the substrate loading step S402. At this time, the substrate W is supported by the robot 170.

(Substrate Moving Step S310)

A substrate moving step S310 will be described. When the second film processing step S308 is completed, the robot 170 unloads the substrate W from the reactor 200 and further moves the substrate W to the load lock chamber 130. With the above, the description of the film-processing step S212 is completed. Thereafter, the process proceeds to the processing history recording step S214.

Figure 12:
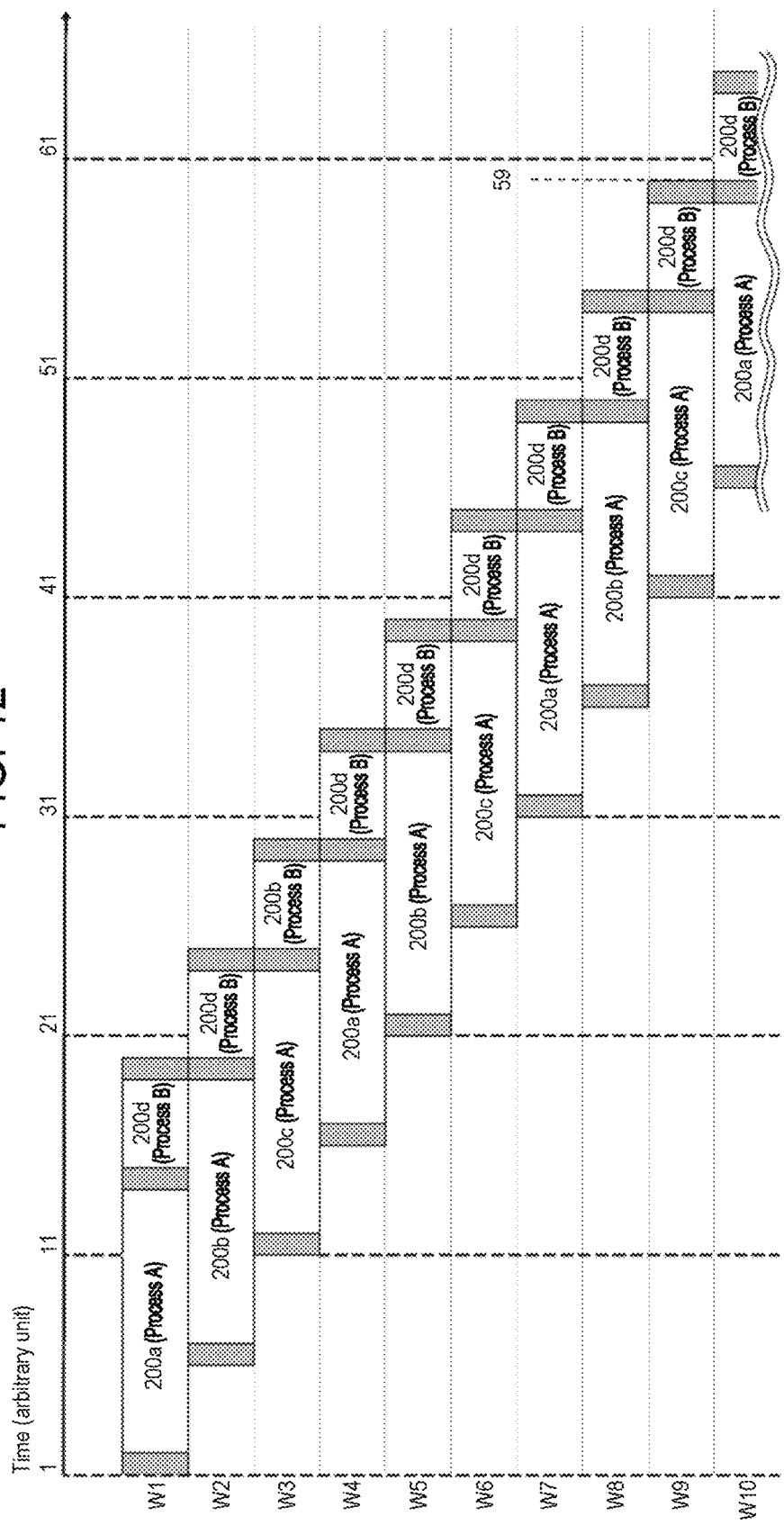
FIG. 12 is an explanatory diagram illustrating a substrate processing sequence according to embodiments.

Subsequently, a sequence of the present embodiments and a sequence of comparative examples will be described with reference to FIGS. 12 to 15. FIGS. 12 and 14 show the present embodiments, and FIGS. 13 and 15 show comparative examples.

W1 to W10 on the vertical axis indicate substrates W to be processed. For example, W1 is a first substrate W to be processed, and W10 is a tenth substrate W to be processed. The horizontal axis indicates a time. The unit is an arbitrary unit. Further, the shading before and after each process indicates a movement time of the substrate W. The movement referred to herein means, for example, a movement between the reactors 200 or a movement between the reactor 200 and the load lock chamber 130. Further, it is assumed that the movement also includes the loading/unloading of one substrate W and the replacement of the substrate W. For the sake of convenience of description, the movement time of the substrate W is assumed to be constant.

Figure 13:
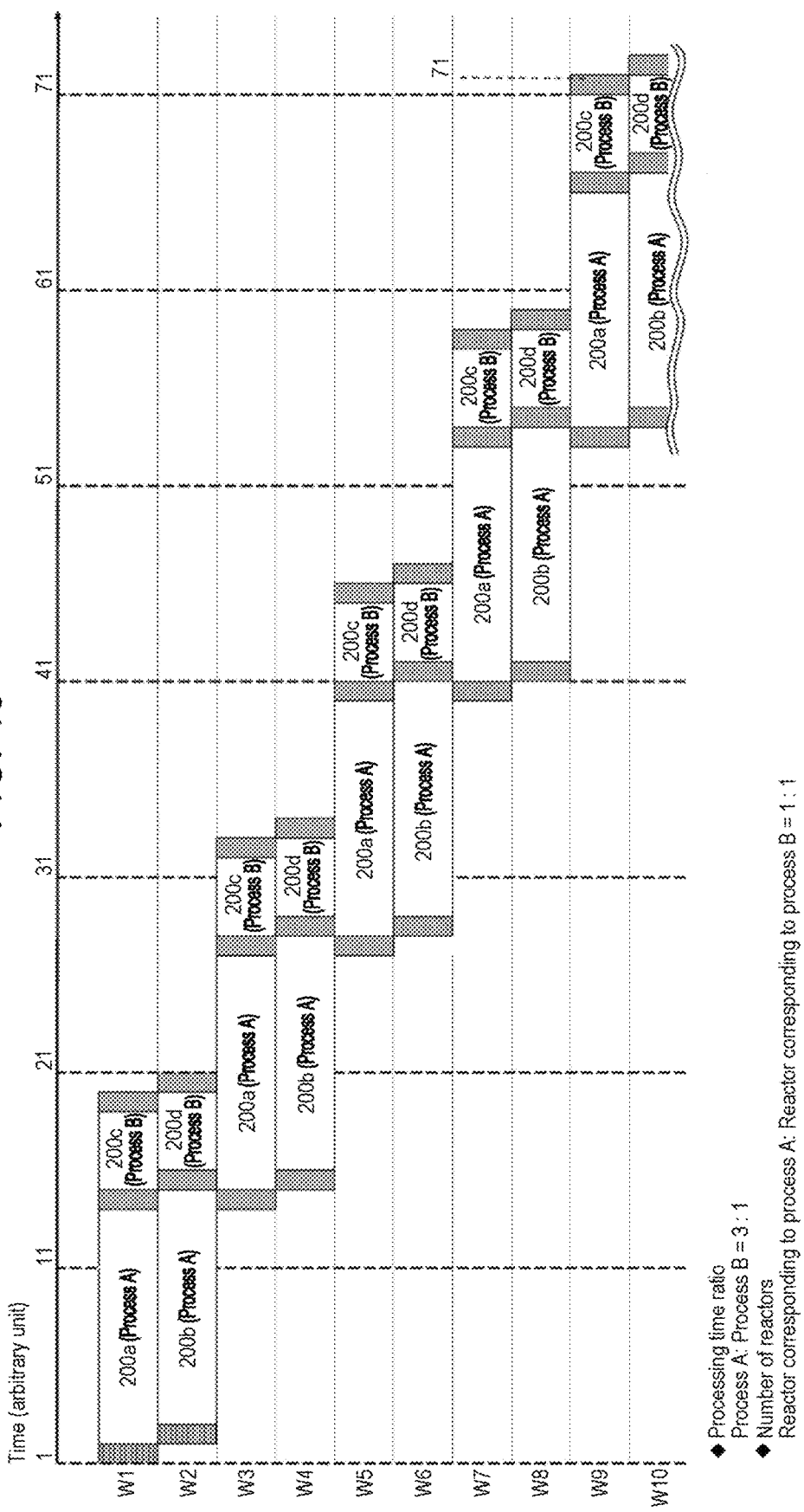
FIG. 13 is an explanatory diagram illustrating a substrate processing sequence according to a comparative example.
Figure 14:
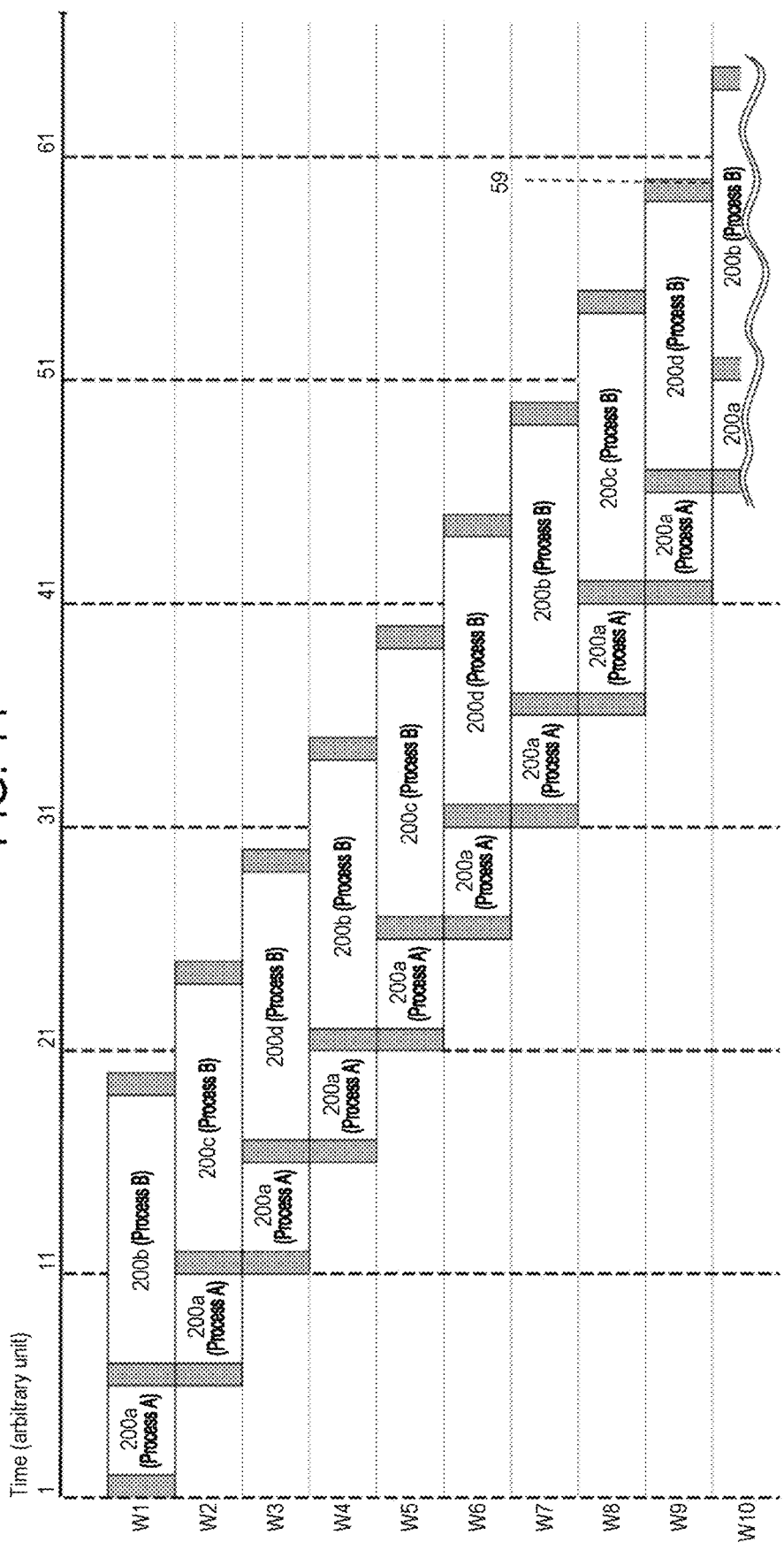
FIG. 14 is an explanatory diagram illustrating a substrate processing sequence according to embodiments.

In FIGS. 12 and 13, a ratio of the processing times of the process A and the process B is 3:1. In FIG. 12, a ratio of the number of reactors is set to 3:1 according to the ratio of the processing times, whereas in FIG. 13, the number of reactors is set to be the same regardless of the ratio of the processing times. Under such conditions, the processing time of the substrate W is calculated.

Figure 15:
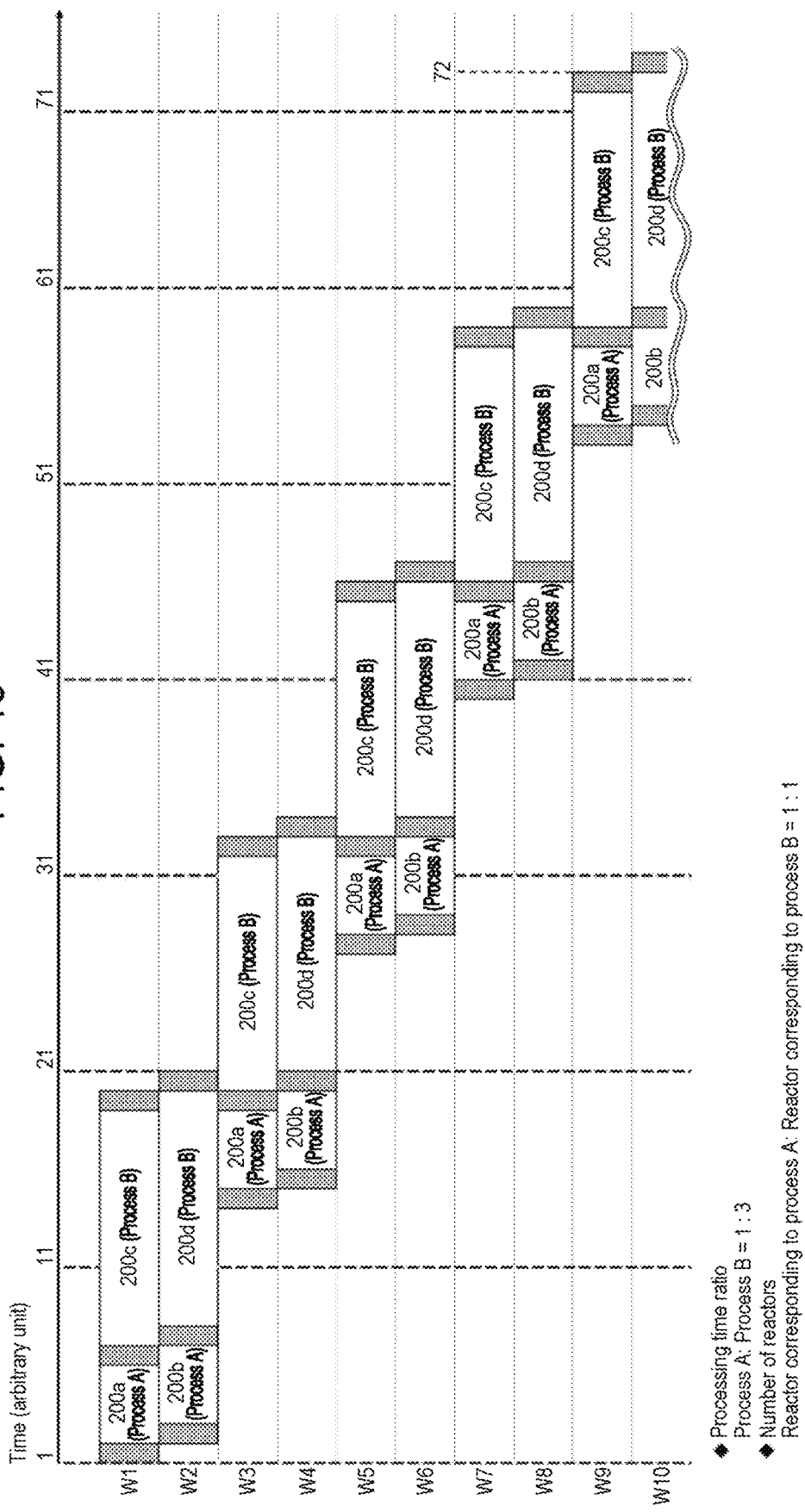
FIG. 15 is an explanatory diagram illustrating a substrate processing sequence according to a comparative example.

In FIGS. 14 and 15, a ratio of the processing times of the process A and the process B is 1:3. In FIG. 14, a ratio of the number of reactors is set to 1:3 according to the ratio of the processing times, whereas in FIG. 15, the number of reactors corresponding to the process A and the number of reactors corresponding to the process B is set to be the same regardless of the ratio of the processing times. Under such conditions, the processing time of the substrate W is calculated.

In the embodiment of FIG. 12, a time at which the processing of a ninth substrate W is completed is 59, whereas in the comparative example of FIG. 13, a time at which the processing of the ninth substrate W is completed is 71. Further, in the embodiment of FIG. 14, a time at which the processing of the ninth substrate W is completed is 59, whereas in the comparative example of FIG. 15, a time at which the processing of the ninth substrate W is completed is 72.

By setting the number of reactors according to the ratio of the processing times in this way, it is possible to enhance the processing throughput. As a result, it is possible to enhance the processing efficiency.

Second Embodiment

Figure 16:
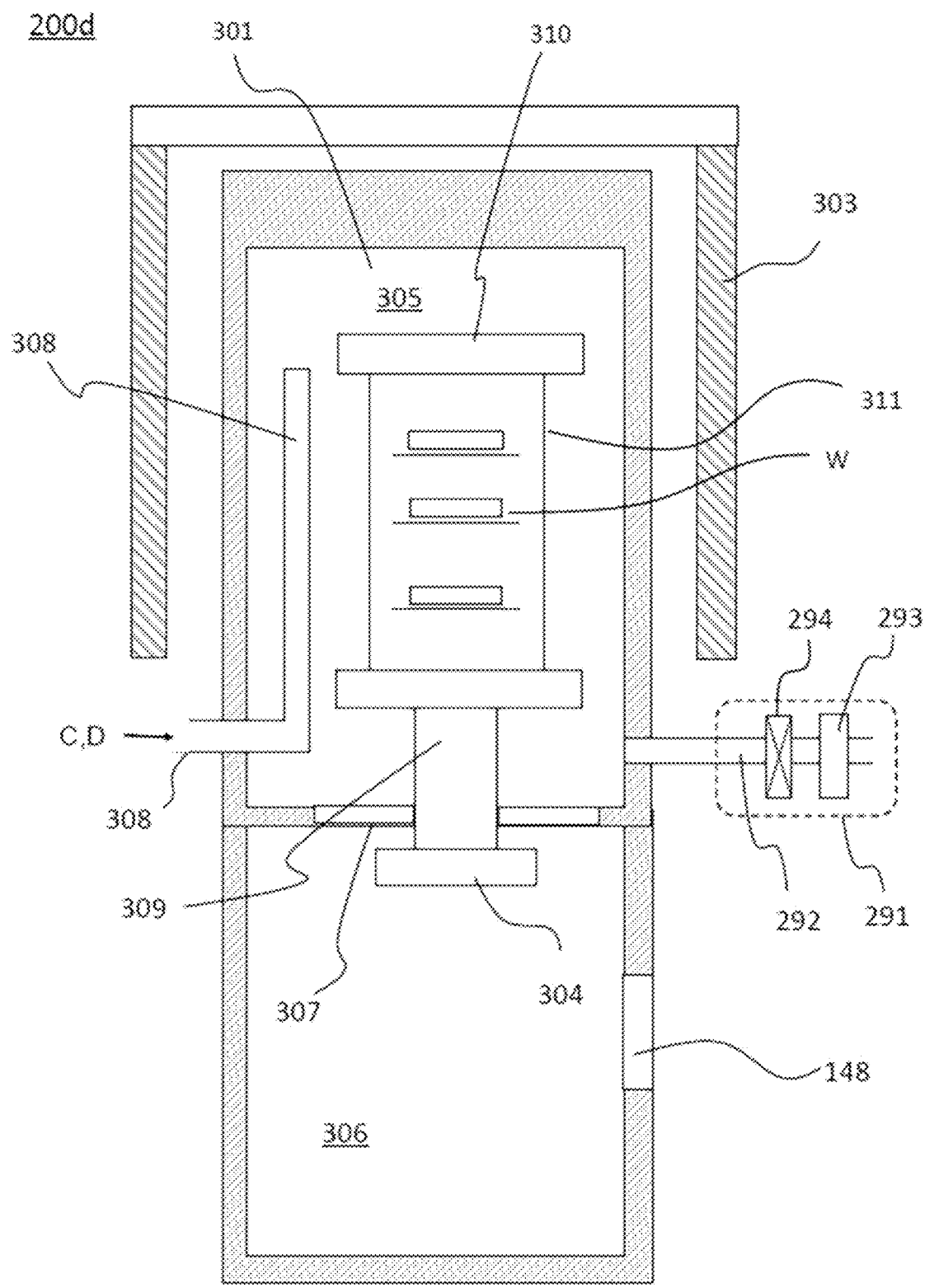
FIG. 16 is an explanatory diagram showing a schematic configuration example of a reactor according to embodiments.

Subsequently, a second embodiment will be described with reference to FIG. 16. In this embodiment, the configuration of the reactor 200 is different from that of the first embodiment. Specifically, for example, in FIG. 1, the reactors 200a to 200c are single-substrate type apparatuses for processing substrates one by one as in the first embodiment, but the reactor 200d is a batch type apparatus capable of processing a plurality of substrates at once. For the sake of convenience of description, the reactor that processes substrates one by one is referred to as first reactor, whereas the reactor that processes substrates in batch processing is referred to as second reactor.

Further, in the first embodiment, the number of reactors is set according to the ratio of the processing times. However, in the present embodiment, the number of substrates to be processed in the first reactor 200 is changed according to the number of substrates to be processed in the second reactor 200 of the substrate processing apparatus 100.

The specific contents will be described below. The first reactor is an apparatus capable of processing substrates one by one, and, for example, the apparatus shown in FIG. 3 is used as in the first embodiment. The number of gas suppliers and the like may vary depending on the process.

Subsequently, the second reactor will be described with reference to FIG. 16. The second reactor 200d will be described. The configurations having the same functions as the reactor shown in FIG. 4 are designated by the same reference numerals, and the description thereof will be omitted.

The reactor 200d is an apparatus capable of processing a plurality of substrates W at once. The reactor 200d includes a process chamber 301 into which a plurality of substrates W is loaded. Below the process chamber 301, there is provided a transfer chamber 306 having a transfer space through which the substrate W passes when the substrate W is transferred to a processing space 305. At this time, the substrate W is transferred while being supported by a boat 310 as a substrate support described later.

A furnace opening is installed between the process chamber 301 and the transfer chamber 306. The furnace opening is an entrance through which the boat 310 passes when the boat 310 is inserted into the process chamber 201. A furnace opening shutter 307 is installed to confine an atmosphere of the process chamber 301 when processing the substrate W. The furnace opening shutter 307 is closed when processing the substrate, and is opened when moving the boat 310.

The boat 310 is configured to accommodate the substrates W supported in a horizontal posture and arranged in multiple stages in a vertical direction. The respective substrates W are supported by a plurality of substrate support portions 311 provided on the boat 310. The substrate support portions 311 are, for example, structures that conform to the outer peripheral shape of the substrate W. The edges of the respective substrates W are supported by these structures. When dummy substrates D are required, the substrate support portions 311 may support the dummy substrates D.

A rotating/elevating mechanism 304 is connected to the boat 310 via a rotation shaft 309. The rotating/elevating mechanism 304 enables the boat 310 to be moved up and down between the process chamber 301 and the transfer chamber 306. Further, by rotating the rotation shaft 309, the boat 310 on which the substrates W mounted is configured to be capable of being rotated while maintaining the airtightness in the process chamber 201.

A gas introduction pipe 308 for introducing a processing gas, a purge gas or the like and an exhauster 291 for exhausting the gas in the process chamber 201 are connected to the process chamber 201.

The gas introduction pipe 308 is a nozzle. A plurality of gas supply holes is installed at a downstream side of the gas introduction pipe 308. The inside of the gas introduction pipe 308 is configured to communicate with the process chamber 301. The processing gas or the like is supplied to the process chamber 301 through the gas supply holes. The gas introduction pipe 308 is connected to the third gas supplier 260 and the fourth gas supplier 270 at an upstream side.

A heater 303 is arranged on the outer periphery of the process chamber 301. The heater 303 is configured to heat the atmosphere in the process chamber 301 such that the inside of the process chamber 301 has a uniform or predetermined temperature distribution as a whole.

Subsequently, a reactor setting step in this embodiment will be described. In this embodiment, as described above, the number of substrates to be processed in the reactor 200d is set according to the ratio of the processing times. For example, when the number of substrates W to be subjected to the process A in the substrate processing apparatus 100 is three and the reactors 200a to 200c are used to process the wafers W, it is assumed that three substrates are processed in the reactor 200d that is the second reactor.

Figure 17:
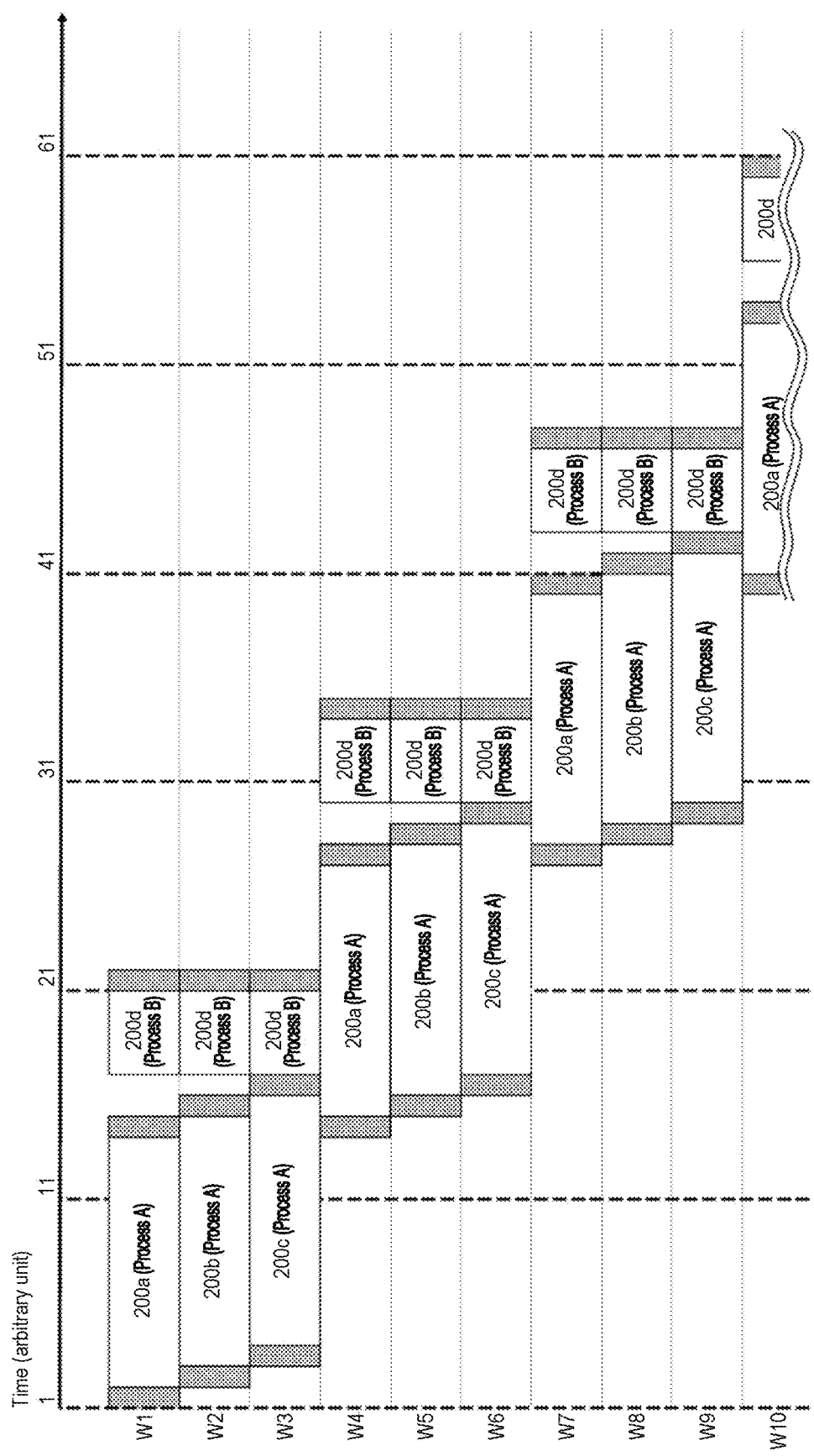
FIG. 17 is an explanatory diagram illustrating a substrate processing sequence according to embodiments.

In this case, as shown in FIG. 17, after processing a total of three substrates W in the reactors 200a to 200c, the respective substrates W are moved to the reactor 200d and collectively subjected to the process B.

Further, when there are two substrates W subjected to the process A, for example, the substrates W are processed in the reactor 200a and the reactor 200b. Then, the respective substrates W are moved to the reactor 200d, and collectively subjected to the process B. At this time, if the substrates W are not supported by some of the substrate support portions 311, dummy substrates D may be supported by the substrate support portions 311. By supporting the dummy substrates D, it is possible to perform the same processing as in the state in which the substrates W are supported by all the substrate support portions 311.

By setting the number of substrates processed in the second reactor according to the total number of substrates processed in the first reactor in this way, it is possible to efficiently perform the processing.

Other Embodiments

Although the embodiments of the present disclosure have been specifically described above, the present disclosure is not limited thereto. Various changes can be made without departing from the spirit thereof.

For example, in the above-described embodiments, it has been described that the film-forming process is performed as the first film-processing process and the modifying process is performed as the second film-processing process. However, the present disclosure is not limited thereto. For example, a first film-forming process may be performed as the first film-processing process, and a second film-forming process may be performed as the second film-processing process to form a laminated film. Further, an ashing process may be performed as the first film-processing process, and an etching process may be performed as the second film-processing process. As described above, it is effective when the substrate is consecutively processed.

Figure 18:
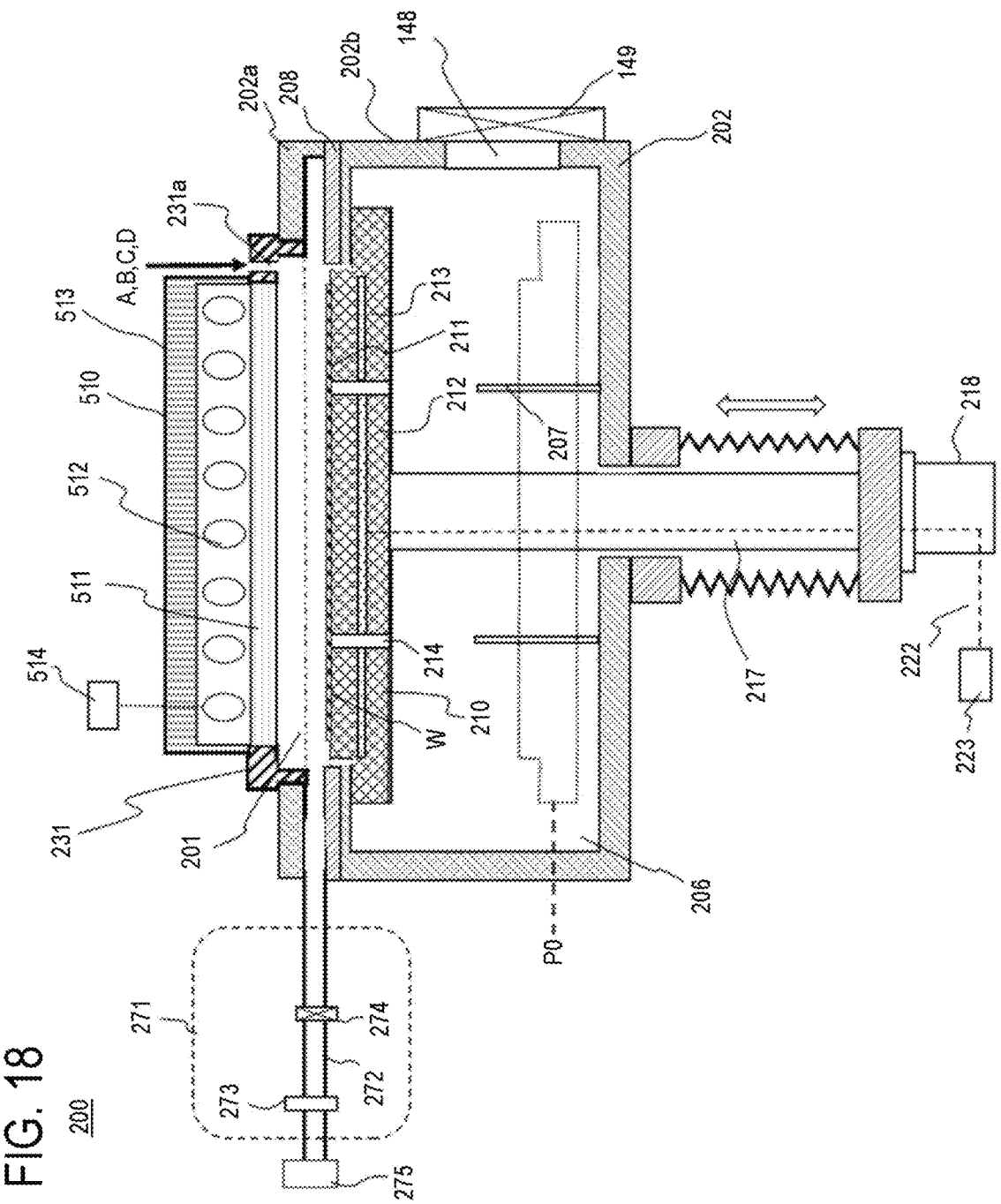
FIG. 18 is an explanatory diagram showing a schematic configuration example of a reactor according to embodiments.

Further, the reactor 200 may include, for example, an activator 510 adjacent to the process chamber 201 as shown in FIG. 18. In the reactor shown in FIG. 18, a window 511 is installed at a ceiling 231 of the reactor 200. Above the window 511, for example, a casing 513 that accommodates a plurality of lamps 512 is installed. A lamp controller 514 is electrically connected to each lamp 512. The lamp controller 514 controls on/off and power of the lamps 512.

When the reactor 200 shown in FIG. 18 is used, for example, the lamps are turned off in the first film processing process to perform a film-forming process in the same manner as in the first film processing process according to the first embodiment, and the lamps are turned on in the second film processing process to perform a modifying process.

Figure 19:
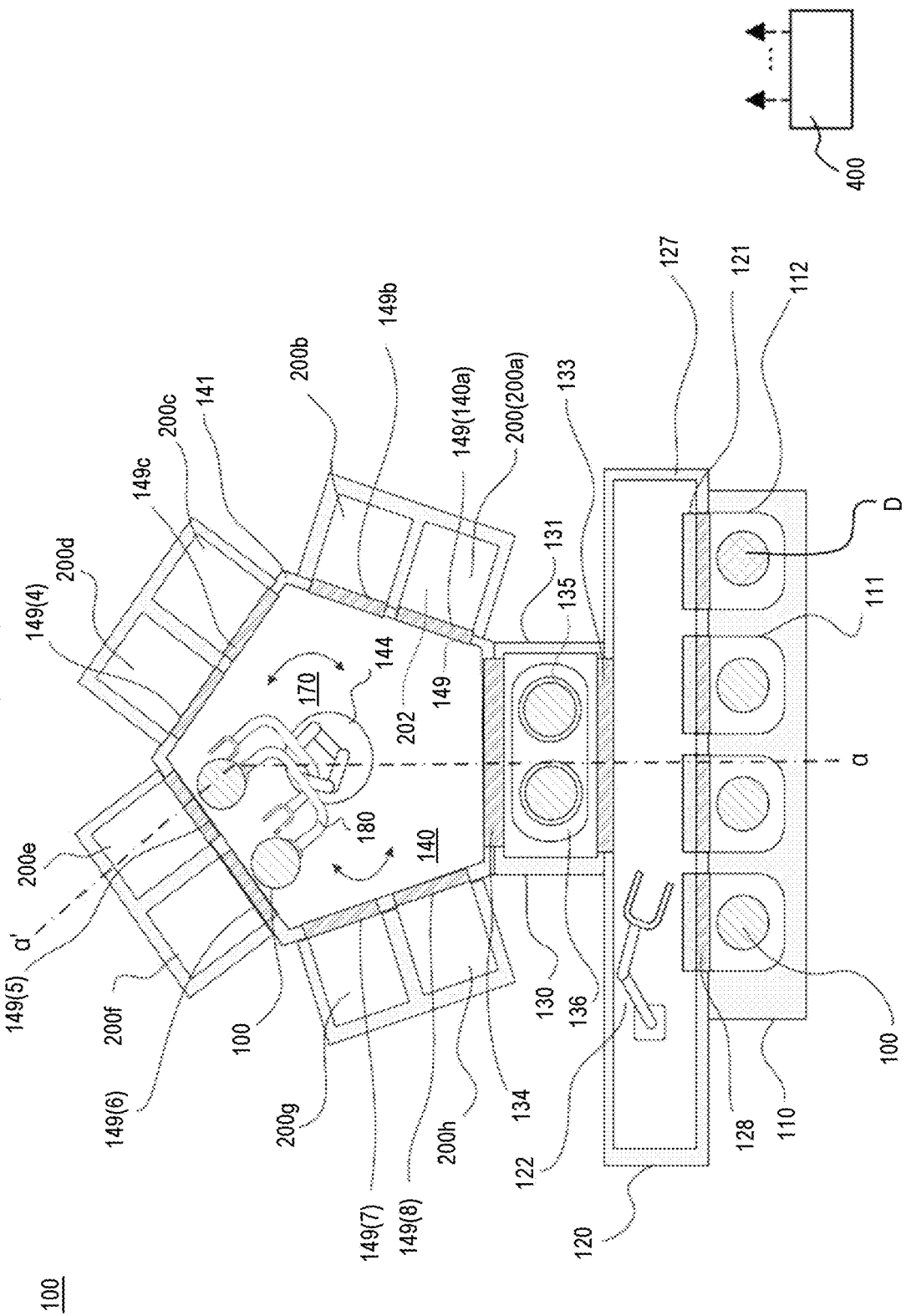
FIG. 19 is an explanatory diagram showing a schematic configuration example of a substrate processing apparatus according to embodiments.

Further, the example in which four reactors 200 are used as the substrate processing apparatus 100 has been described. However, the present disclosure is not limited thereto. As shown in FIG. 19, a substrate processing apparatus using five or more, for example, eight reactors 200 may also be adopted. In this case as well, as in the first embodiment, the number of reactors is set according to the ratio of the processing times. For example, if the ratio of the time of the first film processing process to the time of the second film processing is 3:1, six reactors corresponding to the first film processing process and two reactors corresponding to the second film processing process are set. Specifically, for example, six reactors are set so that the first film processing process can be performed in the reactors 200a to 200f, and two reactors are set so that the second film processing process can be performed in the reactors 200g and 200h. Further, if the ratio of the time of the first film processing process to the time of the second film processing is 1:3, for example, two reactors are set so that the first film processing process can be performed in the reactors 200a and 200b, and six reactors are set so that the second film processing process can be performed in the reactors 200c to 200h.

By setting the reactors according to the ratio of the processing times in this way, it is possible to efficiently perform the processing.

Further, for example, in each of the above-described embodiments, there has been described the case where the SiN film is formed on the substrate W by using the HCDS gas as the first-element-containing gas (first processing gas) and using the $NH_3$ gas as the second-element-containing gas (second processing gas) in the film-forming process performed by the substrate processing apparatus. However, the present disclosure is not limited thereto. That is, the processing gases used for the film-forming process are not limited to the HCDS gas, the $NH_3$ gas and the like. Other types of thin films may be formed by using other types of gases. Furthermore, three or more kinds of processing gases may be used. Moreover, the first element may not be Si but may be, for example, various elements such as titanium (Ti), zirconium (Zr), hafnium (Hf) and the like. In addition, the second element may not be H but may be, for example, nitrogen (N) or the like.

Further, for example, in each of the above-described embodiments, it has been described that the processing is performed by using the H-containing gas as the modifying gas. However, the present disclosure is not limited thereto. It may be possible to use, for example, a gas containing oxygen (O), nitrogen (N), carbon (C), hydrogen (H) or a combination thereof.

Further, for example, in each of the above-described embodiments, there has been described the example in which the modifying process is performed after the film-forming process. However, the present disclosure is not limited thereto. The film-forming process may be performed after the modifying process.

Further, for example, in each of the above-described embodiments, the film-forming process and the modifying process are given as examples of the processes performed by the substrate processing apparatus. However, the present disclosure is not limited thereto. That is, the present disclosure may be applied to a film-forming process and a modifying process other than the thin film exemplified in each of the above-described embodiments, in addition to the film-forming process and the modifying process given as examples in each of the above-described embodiments. In addition, the specific content of the substrate processing process does not matter. The present disclosure may be applied not only to the film-forming process and the modifying process, but also to other substrate processing processes such as an annealing process, a diffusion process, an oxidizing process, a nitriding process, a lithography process and the like. Further, the present disclosure may be applied to other substrate processing apparatuses such as an annealing apparatus, an etching apparatus, an oxidizing apparatus, a nitriding apparatus, an exposure apparatus, a coating apparatus, a drying apparatus, a heating apparatus, a processing apparatus using plasma, and the like. Further, it is possible to replace some of the configurations of one embodiment with the configurations of another embodiment, and it is also possible to add the configurations of another embodiment to the configurations of one embodiment. It is also possible to add, delete, or replace some of the configurations of each of the above-described embodiments with other configurations.

According to the present disclosure in some embodiments, it is possible to provide a technique capable of enhancing process efficiency.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
receiving type information, which includes processing time information of a plurality of predetermined processes, for substrate processing that includes the plurality of predetermined processes;
reading the type information and the processing time information corresponding to the type information from a memory;
calculating a ratio of a processing time for each of the predetermined processes to a total time of the plurality of predetermined processes based on the processing time information;
selecting a set of one or more reactors among a plurality of reactors according to the ratio for one among the plurality of predetermined processes;
setting the selected set of one or more reactors to be capable of performing the one among the plurality of predetermined processes;
transferring substrates corresponding to the type information to the selected set of one or more reactors; and
performing the one of the plurality of predetermined processes corresponding to the type information in the selected set of one or more reactors,
wherein a processing history of the plurality of predetermined processes performed in each of the plurality of reactors is recorded in the memory, and
wherein in the act of selecting the set of one or more reactors, the set of one or more reactors is selected according to the processing history.

2. The method of claim 1, wherein in the act of selecting, a number of reactors in the selected set of one or more reactors is selected according to the ratio.

3. The method of claim 1, wherein the predetermined process is a film-forming process or a modifying process.

4. The method of claim 1, wherein the type information is information on a film-forming process or information on a modifying process.

5. The method of claim 1, wherein after performing the predetermined process corresponding to the type information in the selected set of one or more reactors, the substrates are moved to other set of one or more reactors different from the one or more reactors, and a process different from the predetermined process is performed.

6. The method of claim 5, wherein a processing time in the selected set of one or more reactors is longer than a processing time in the other set of one or more reactors.

7. The method of claim 5, wherein a processing time in the selected set of one or more reactors is shorter than a processing time in the other set of one or more reactors.

8. The method of claim 1, wherein the processing time is a time taken from a time at which the substrate is loaded to a time at which the substrate is unloaded.

9. The method of claim 1, wherein a gas supplier capable of being used in a first film processing to form a film and a gas supplier capable of being used in a second film processing to process the film are connected to the selected set of one or more reactors, and
wherein a processing setter sets an operation of each of the gas suppliers according to the first film processing and the second film processing.

10. The method of claim 9, wherein in the first film processing, the gas supplier capable of being used in the first film processing is configured to supply a gas used for the first film processing into the selected set of one or more reactors, and the gas supplier capable of being used in the second film processing is configured not to supply a gas used for the second film processing into the selected set of one or more reactors.

11. The method of claim 10, wherein the gas used for the second film processing is discharged via a bypass pipe.

12. The method of claim 1, wherein each of the selected set of one or more reactors are provided with an activator, and
wherein a process setter sets the activator not to operate in a first film processing to form a film and to operate in a second film processing to process the film.

13. The method of claim 1, wherein the information on the processing history is information on a cumulative processing time for the type information.

14. The method of claim 1, wherein the information on the processing history is information on a cumulative processing time of component use for the type information.

15. The method of claim 1, wherein a processing history is recorded after performing the predetermined process corresponding to the type information.

16. The method of claim 1, wherein after performing the predetermined process corresponding to the type information, a processing history for the type information is recorded for each of the selected set of one or more reactors.

17. A non-transitory computer-readable recording medium recording a program that causes, by a computer, a substrate processing apparatus to perform the method of claim 1.

18. A method of manufacturing a semiconductor device, comprising:
- receiving type information, which includes processing time information of a plurality of predetermined processes, for substrate processing that includes the plurality of predetermined processes;
- reading the type information and the processing time information corresponding to the type information from a memory;
- calculating a ratio of a processing time for each of the plurality of predetermined processes to a total time of the plurality of predetermined processes based on the processing time information;
- selecting a set of one or more reactors among a plurality of reactors according to the ratio for each of the plurality of predetermined processes;
- setting the selected set of one or more reactors to be capable of performing each of the plurality of predetermined processes;
- transferring substrates corresponding to the type information to the selected set of one or more reactors; and
- performing each of the plurality of predetermined processes corresponding to the type information in the selected set of one or more reactors, wherein a processing history of the plurality of predetermined processes performed in each of the plurality of reactors is recorded in the memory, and wherein in the act of selecting the set of one or more reactors, the set of one or more reactors is selected according to the processing history.

* * * * *